United States Patent
Kim et al.

(10) Patent No.: US 12,136,799 B2
(45) Date of Patent: Nov. 5, 2024

(54) SURFACE EMITTING LASER DEVICE AND A LIGHT EMITTING DEVICE INCLUDING THE SAME

(71) Applicant: SUZHOU LEKIN SEMICONDUCTOR CO., LTD., Taicang (CN)

(72) Inventors: Myung Sub Kim, Seoul (KR); Ju Young Park, Seoul (KR); Jun Hee Park, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 733 days.

(21) Appl. No.: 17/283,200

(22) PCT Filed: Oct. 29, 2019

(86) PCT No.: PCT/KR2019/014329
§ 371 (c)(1),
(2) Date: Apr. 6, 2021

(87) PCT Pub. No.: WO2020/091365
PCT Pub. Date: May 7, 2020

(65) Prior Publication Data
US 2022/0416507 A1   Dec. 29, 2022

(30) Foreign Application Priority Data

Oct. 31, 2018 (KR) ........................ 10-2018-0131802

(51) Int. Cl.
*H01S 5/183* (2006.01)
*H01S 5/32* (2006.01)

(52) U.S. Cl.
CPC ...... *H01S 5/18394* (2013.01); *H01S 5/18361* (2013.01); *H01S 5/3211* (2013.01)

(58) Field of Classification Search
CPC ............. H01S 5/18394; H01S 5/18361; H01S 5/3211; H01S 5/18338; H01S 5/18352;
(Continued)

(56) References Cited

U.S. PATENT DOCUMENTS 7,336,688 B2 * 2/2008 Ueki ...................... B82Y 20/00
372/45.01
7,526,008 B2   4/2009 Shiozaki
(Continued)

FOREIGN PATENT DOCUMENTS

JP   2006-41181 A   2/2006
JP   2006-120881 A   5/2006
(Continued)

*Primary Examiner* — Xinning(Tom) Niu
(74) *Attorney, Agent, or Firm* — Birch, Stewart, Kolasch & Birch, LLP

(57) ABSTRACT

An embodiment relates to a surface emitting laser device and a light emitting device including the same. The surface emitting laser device according to the embodiment may include a first reflective layer; an active layer disposed on the first reflective layer; an active region disposed on the active layer and having an aperture and an insulation region disposed around the aperture; and a second reflective layer disposed on the active region. The second reflective layer may include a core reflective layer disposed in a position vertically corresponding to the aperture. The embodiment may include a cladding insulation layer disposed around the core reflective layer. The horizontal cross-section of the aperture may be different from the horizontal cross-section of the core reflective layer.

16 Claims, 25 Drawing Sheets

(58) Field of Classification Search
CPC ........... H01S 5/34313; H01S 2301/166; H01S 5/18386; H01S 5/18391; H01S 5/18311
See application file for complete search history.

(56) References Cited

U.S. PATENT DOCUMENTS

| | | | |
|---|---|---|---|
| 7,675,956 | B2 | 3/2010 | Maeda et al. |
| 2001/0050934 | A1* | 12/2001 | Choquette ............. H01S 5/1833 372/50.11 |
| 2002/0150135 | A1* | 10/2002 | Naone ................. H01S 5/18369 372/45.011 |
| 2003/0026308 | A1 | 2/2003 | Iwai et al. |
| 2004/0120376 | A1* | 6/2004 | Kwak ................. H01S 5/18311 372/96 |
| 2008/0069166 | A1* | 3/2008 | Lee .................... H01S 5/18391 372/50.11 |
| 2011/0304682 | A1* | 12/2011 | Irinoda ............... H01S 5/04254 372/44.01 |
| 2018/0212403 | A1 | 7/2018 | Chen et al. |
| 2019/0214788 | A1* | 7/2019 | Kang ................. H01S 5/18361 |

FOREIGN PATENT DOCUMENTS

| | | |
|---|---|---|
| JP | 2008-244060 A | 10/2008 |
| KR | 10-2017-0036521 A | 4/2017 |

* cited by examiner

[FIG. 1]
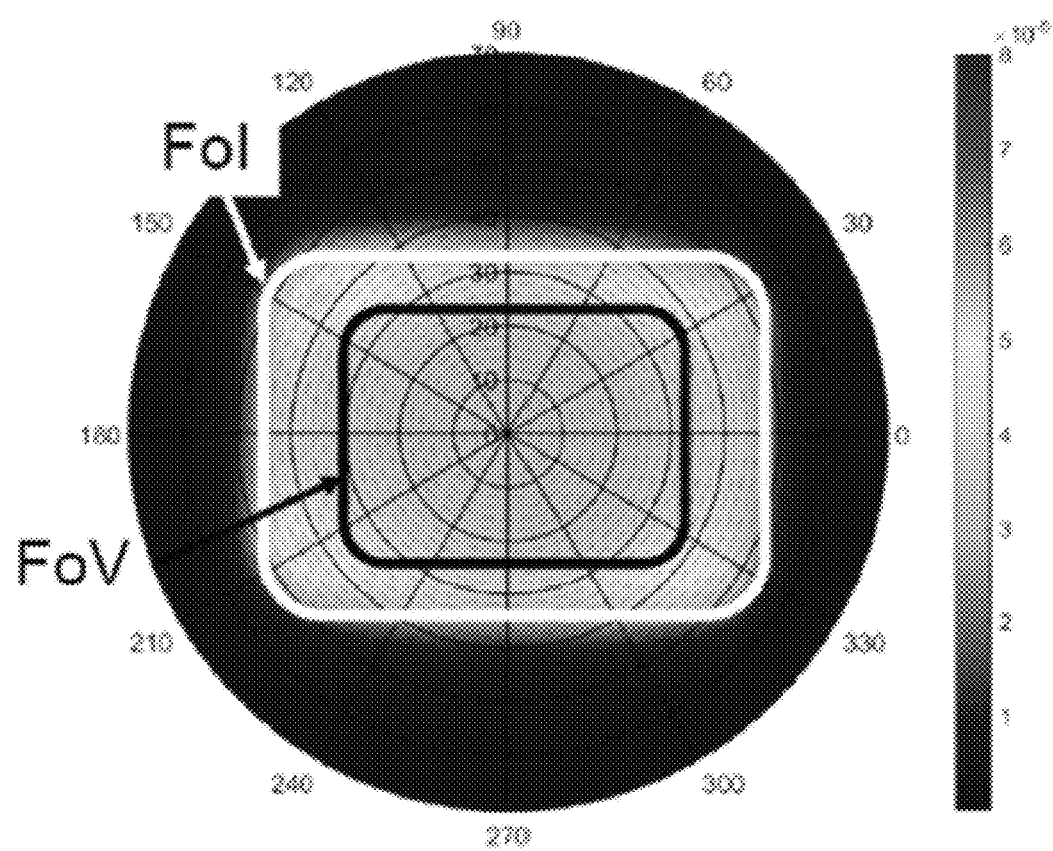

[FIG. 2a]
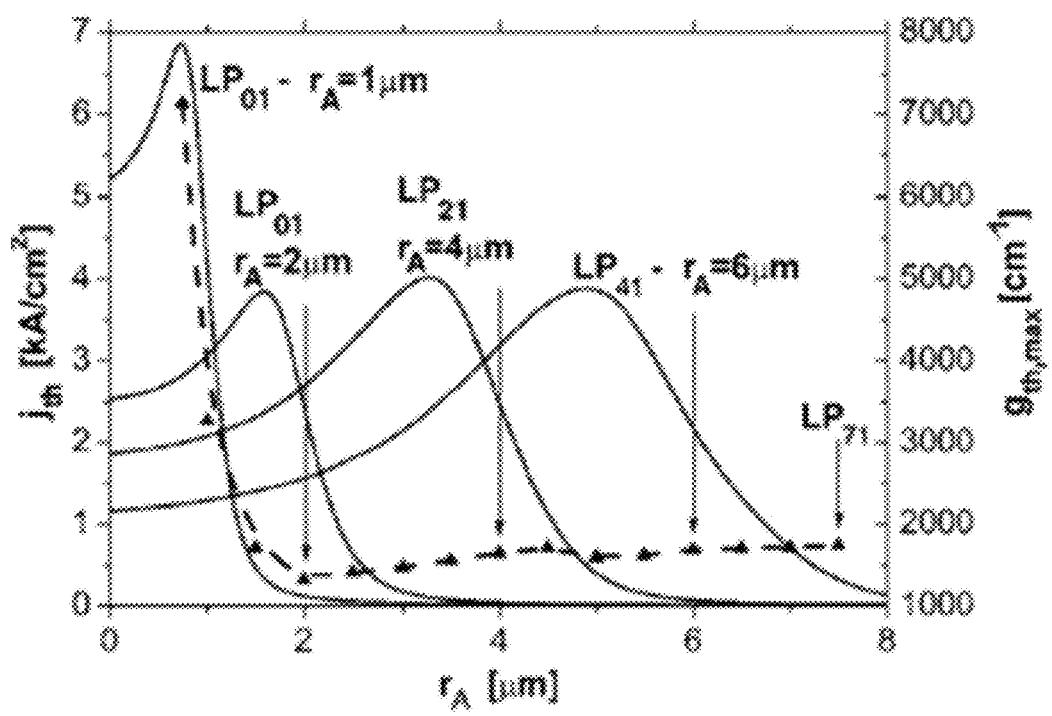

[FIG. 2b]
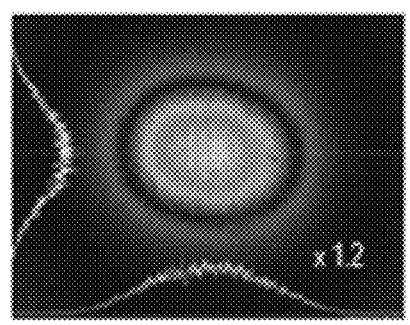
(b1)
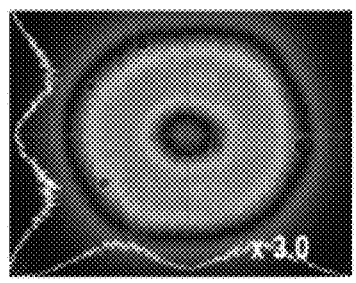  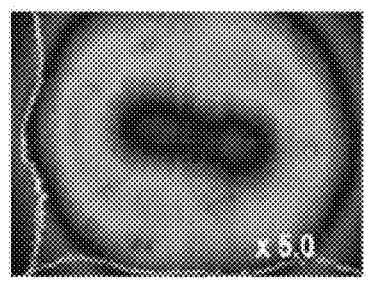
(b2)   (b3)

[FIG. 2c]
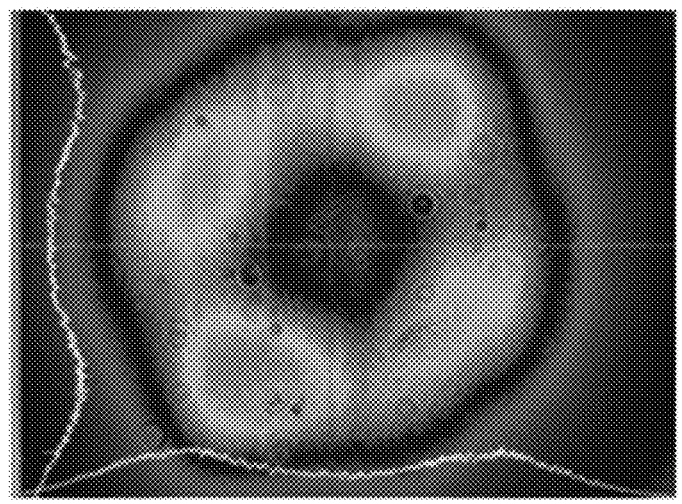

[FIG. 3]
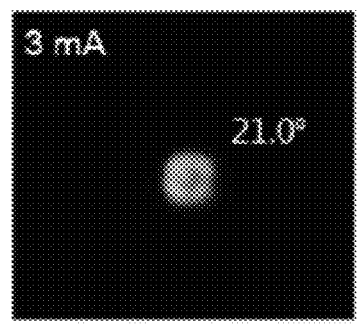
(d1)
(d2)
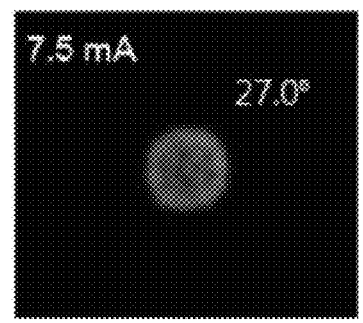
(d3)
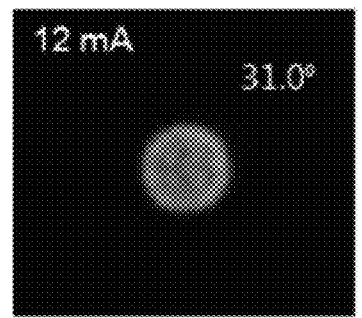
(d4)

[FIG. 4a]
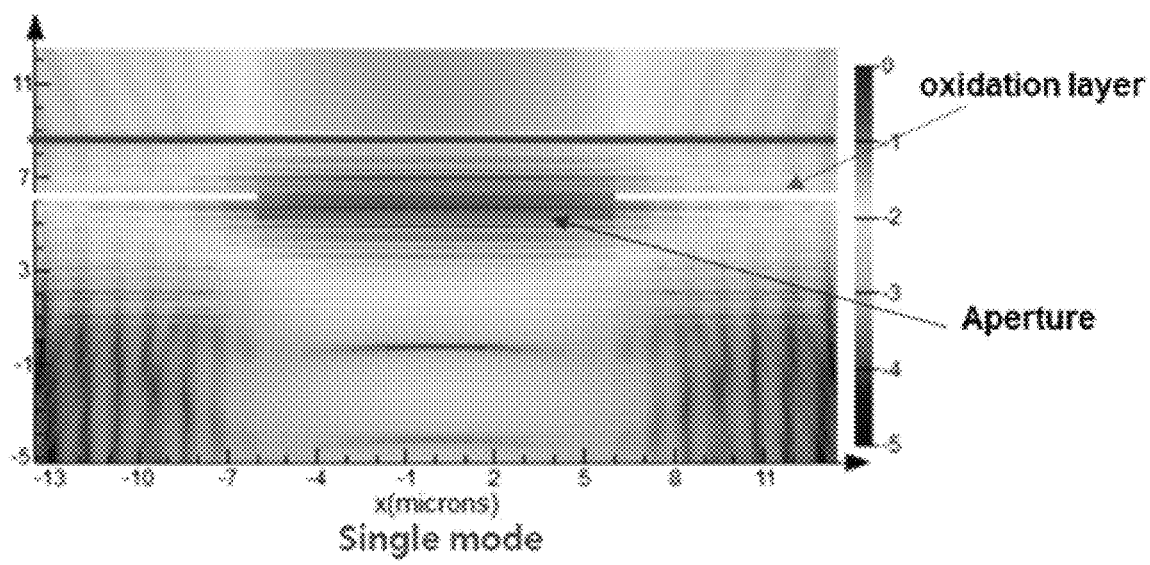
Single mode
[FIG. 4b]
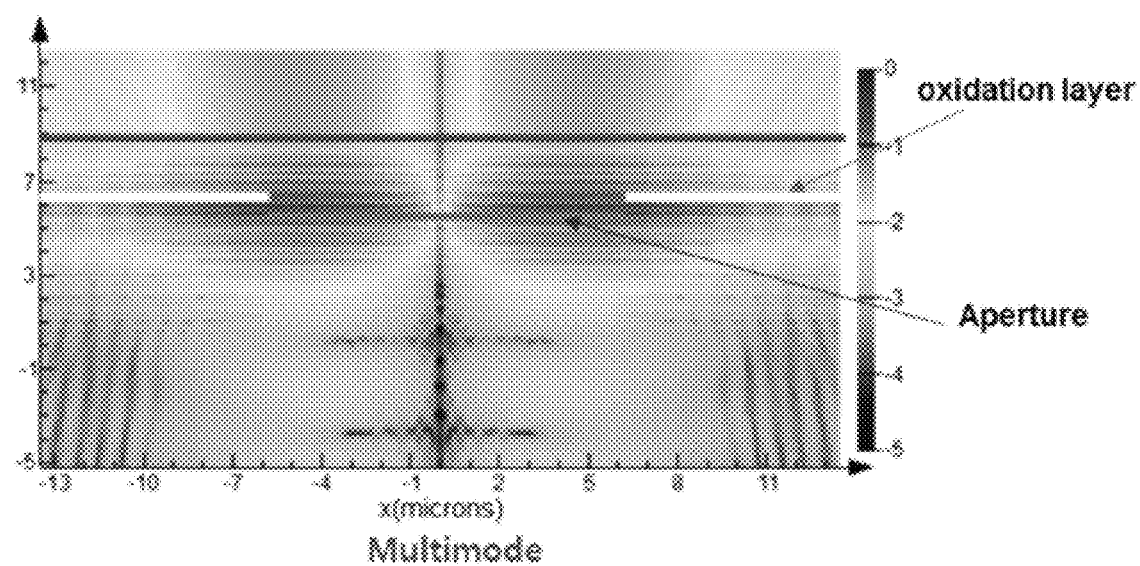
Multimode

[FIG. 5]
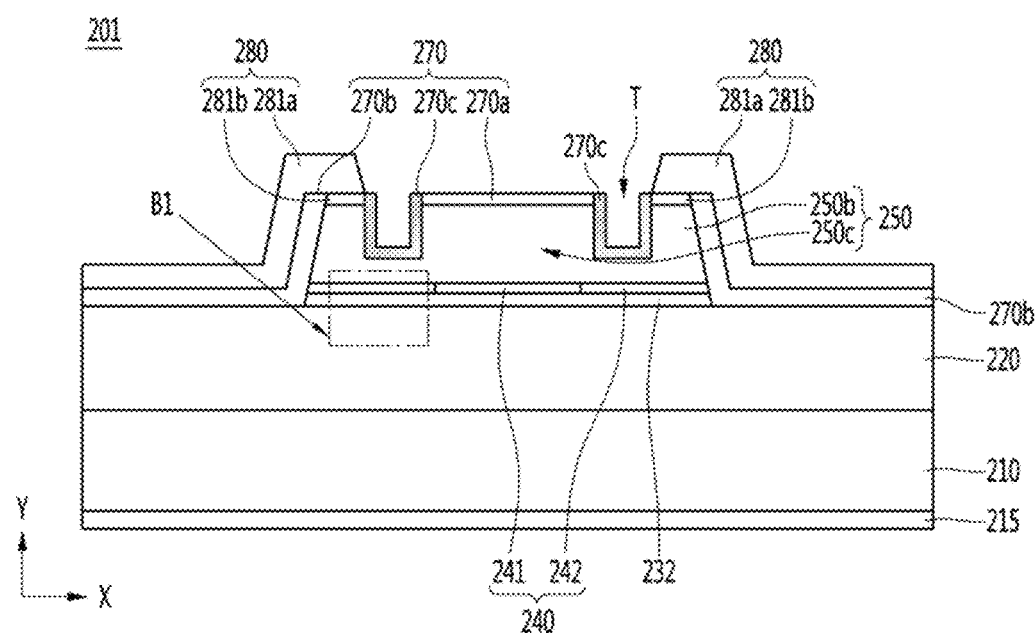

[FIG. 6]
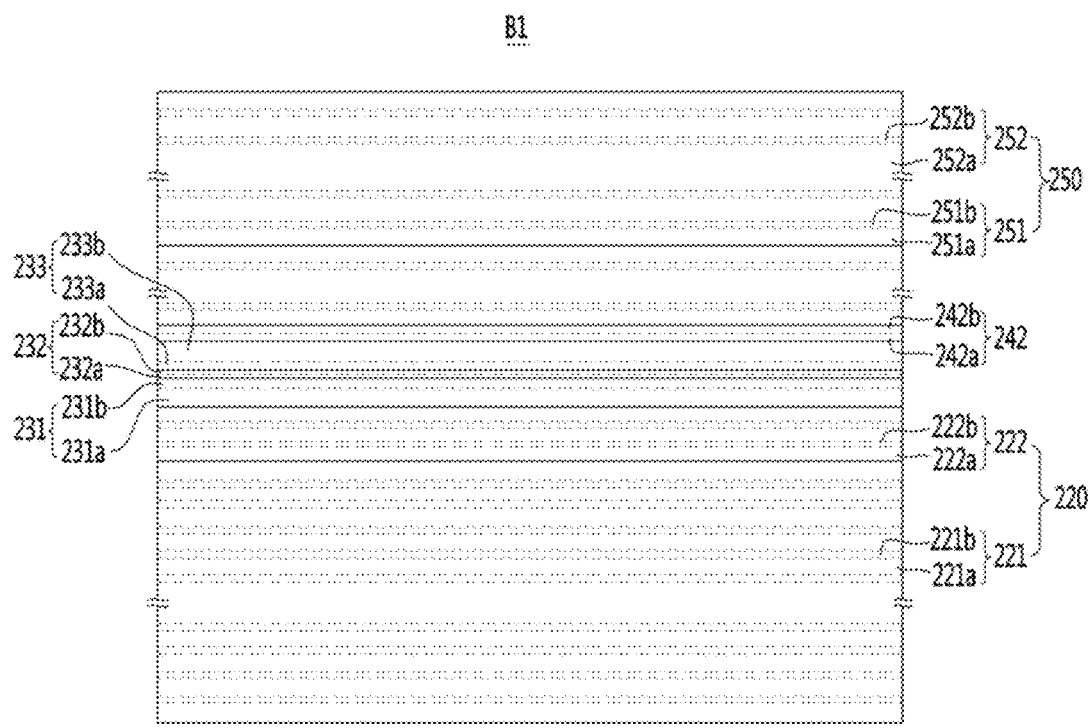
[FIG. 7a]
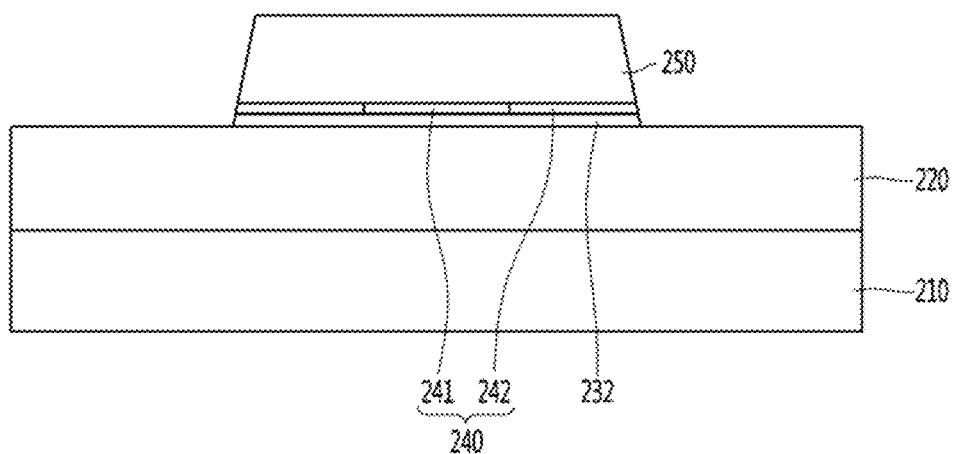

[FIG. 7b]
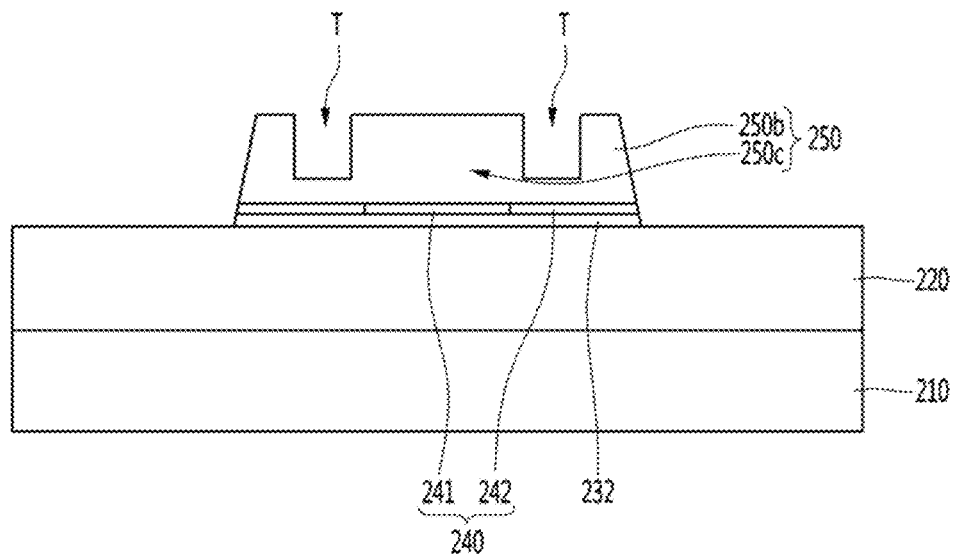
[FIG. 7c]
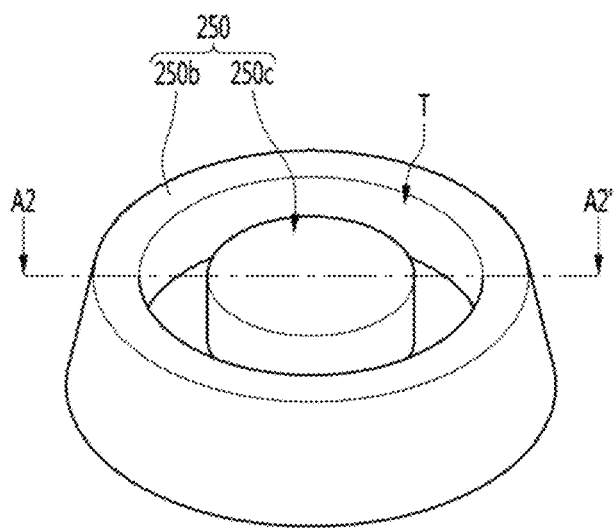

[FIG. 7d]
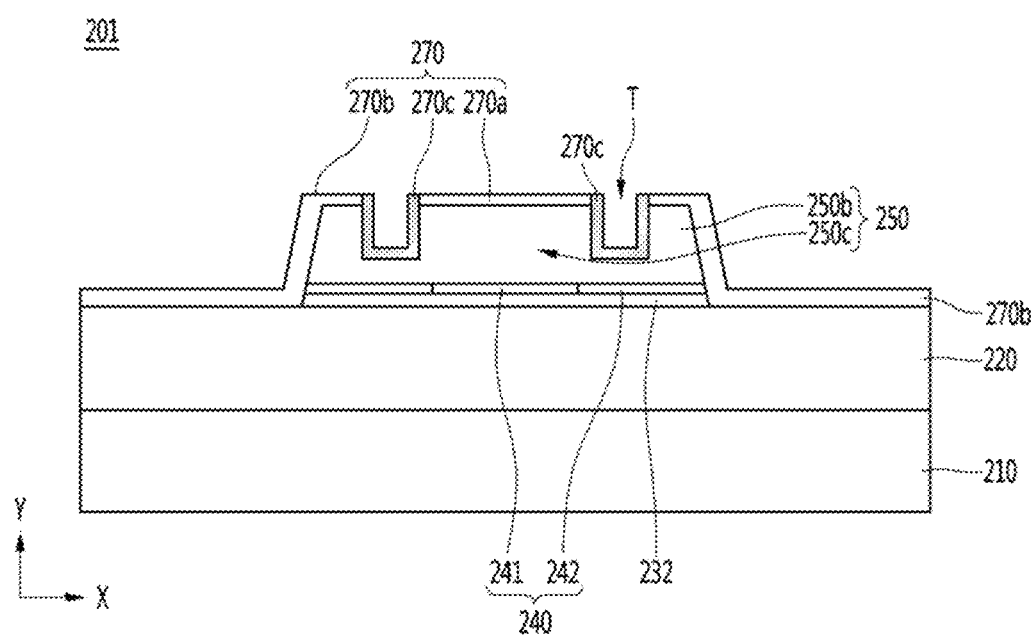

[FIG. 7e]
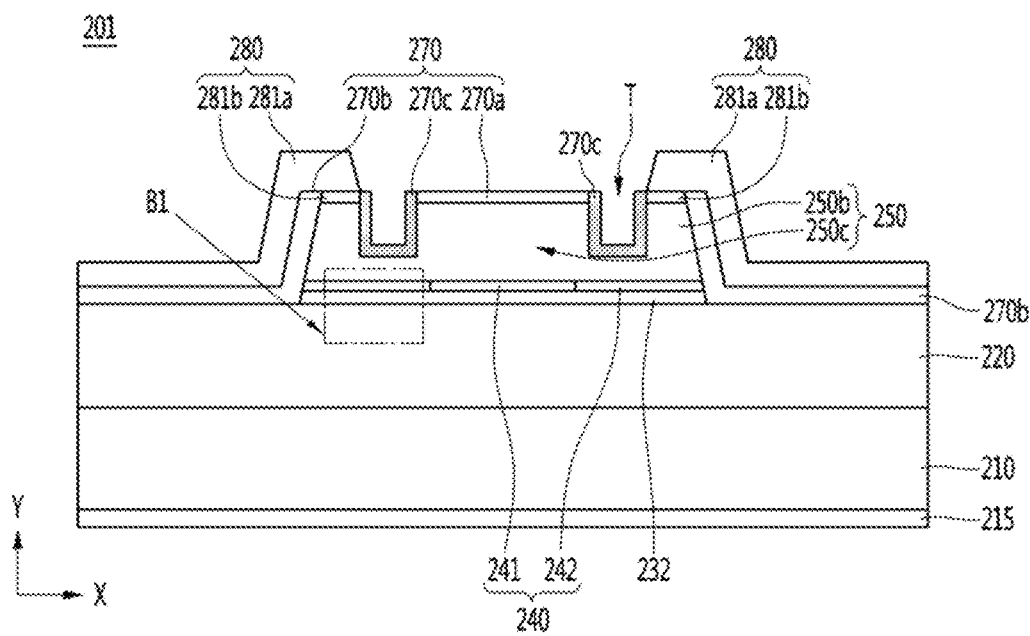
[FIG. 8a]
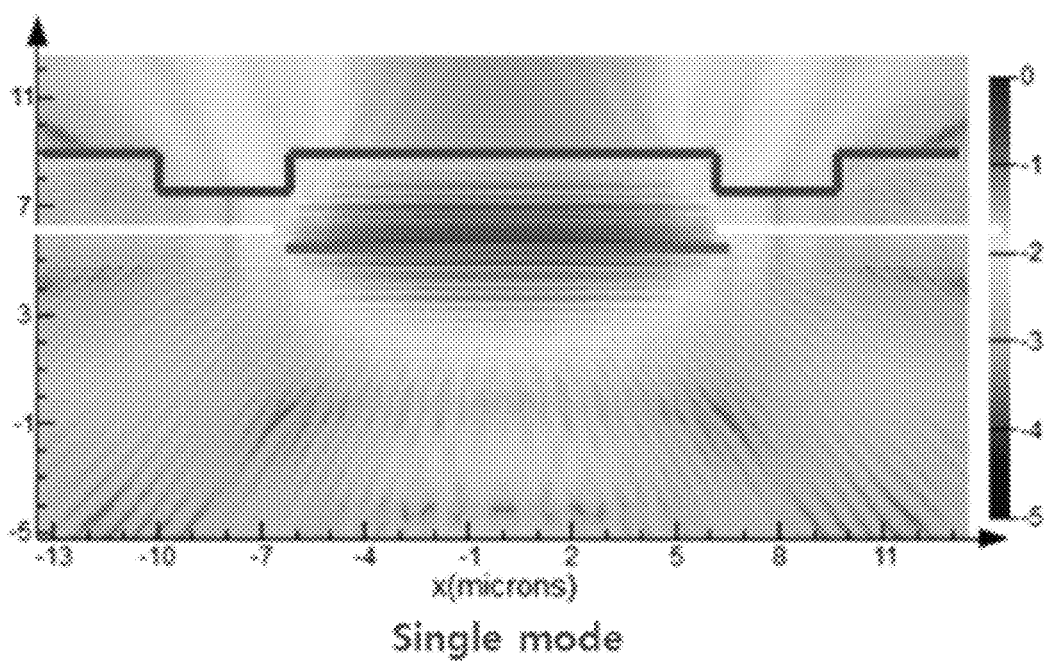

[FIG. 8b]
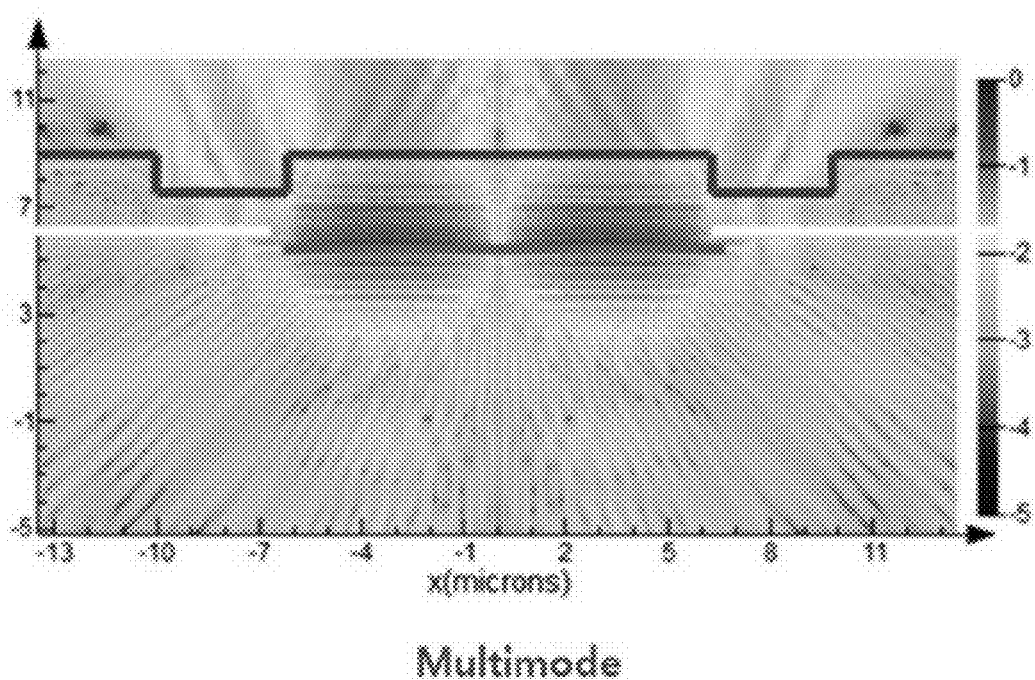
Multimode

[FIG. 9a]
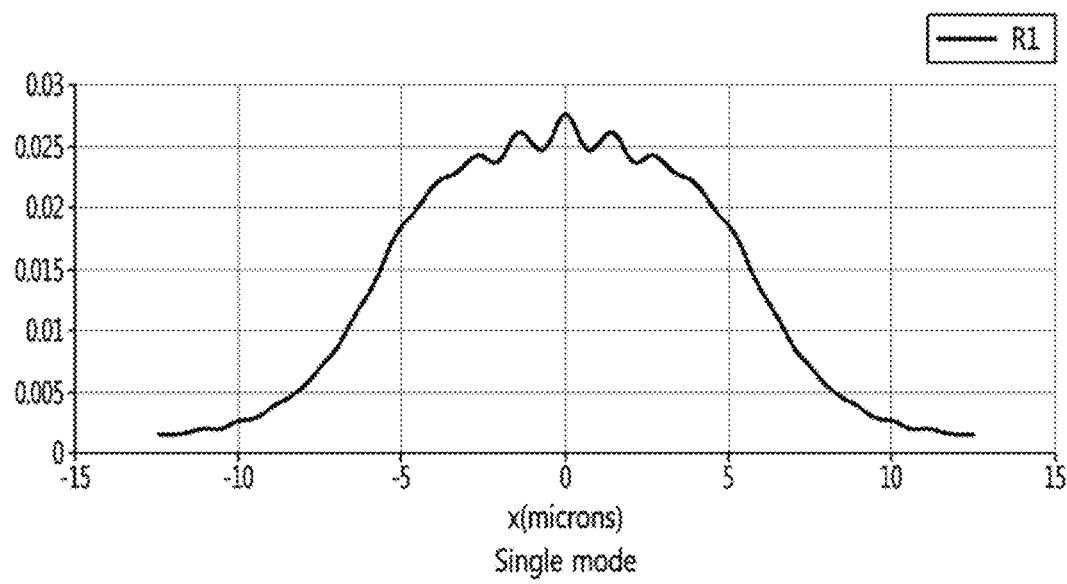
Single mode
[FIG. 9b]
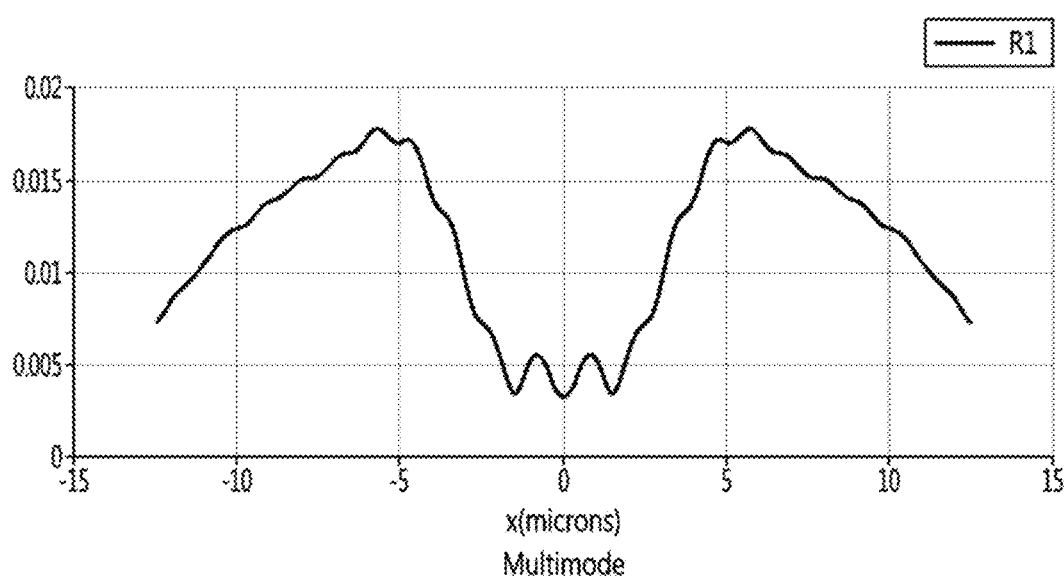
Multimode

[FIG. 10a]
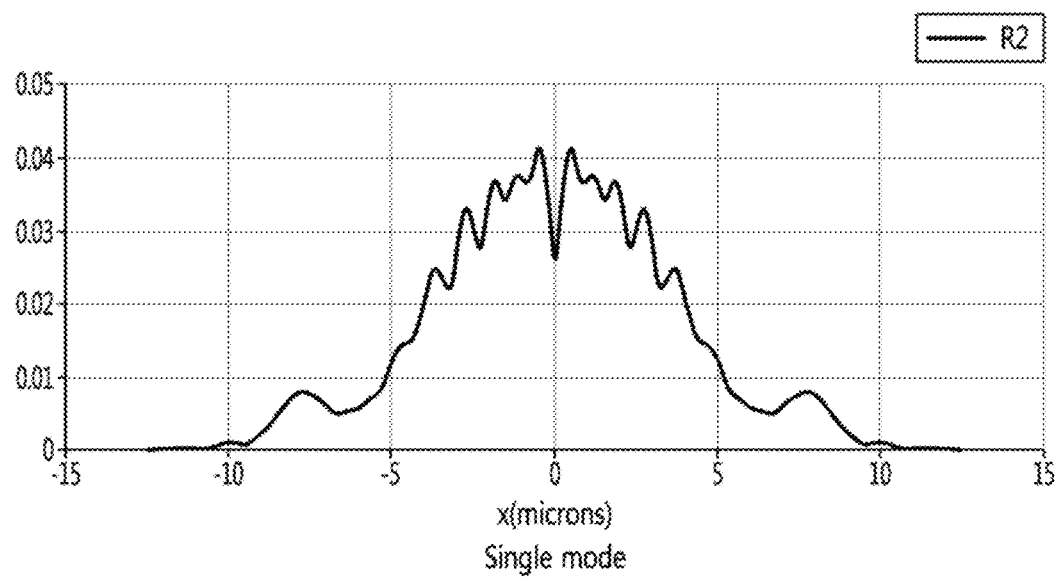
x(microns)
Single mode
[FIG. 10b]
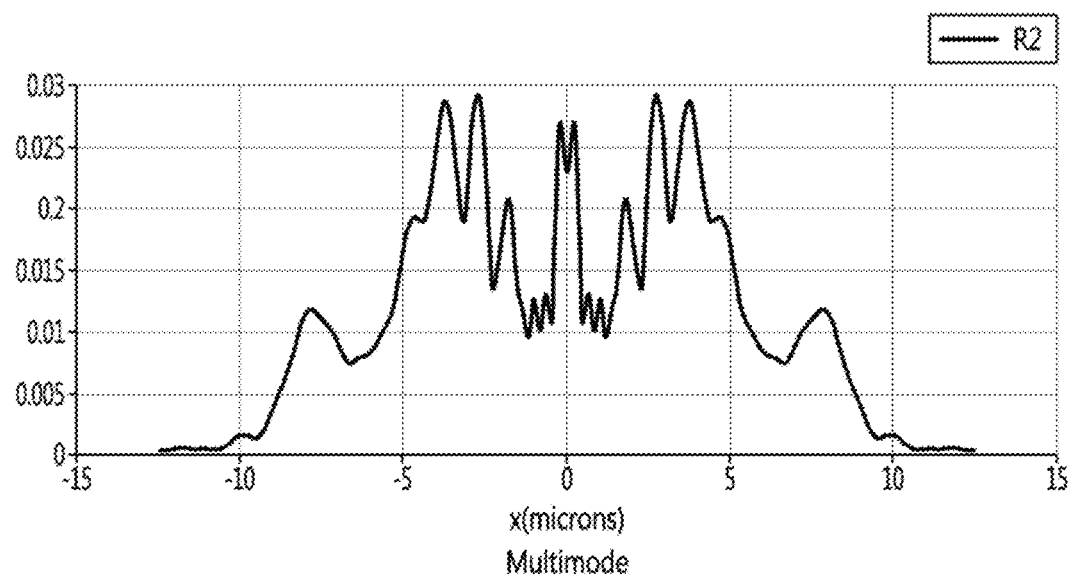
x(microns)
Multimode

[FIG. 11a]
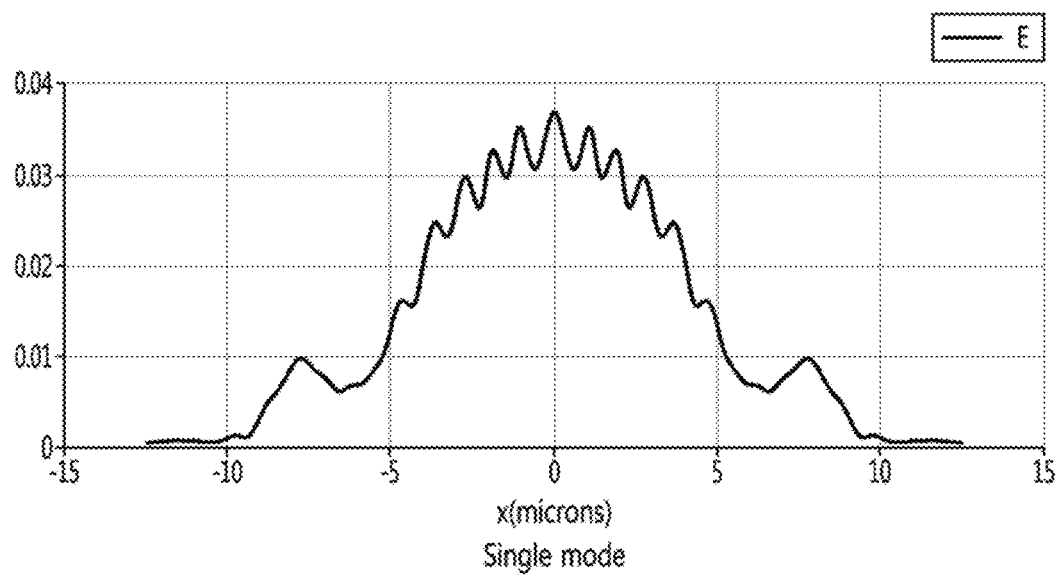
Single mode
[FIG. 11b]
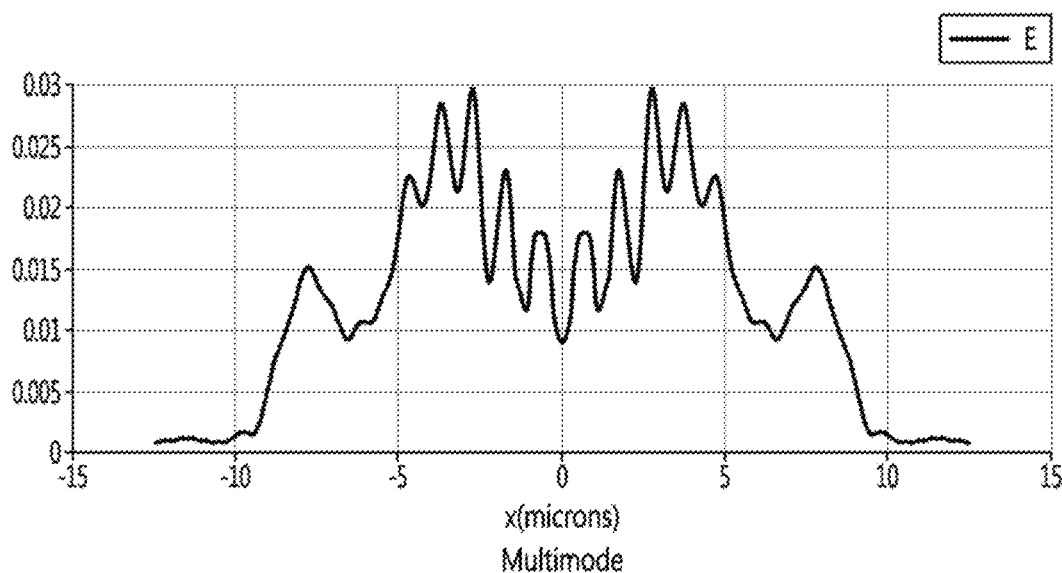
Multimode

[FIG. 12a]
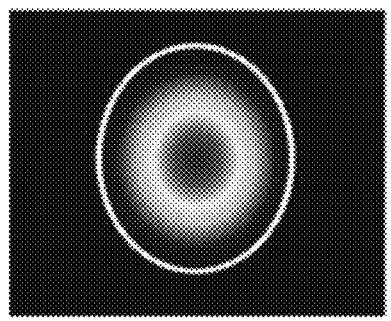 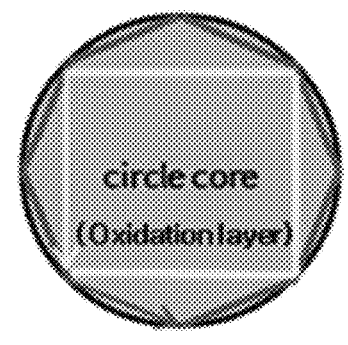
(a1)　　　　　(a2)　　　　　(a3)
[FIG. 12b]
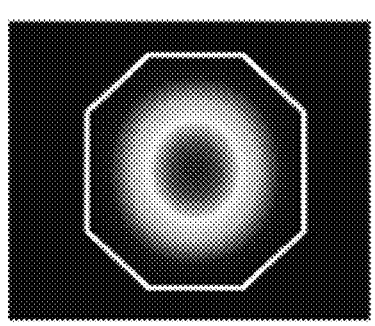 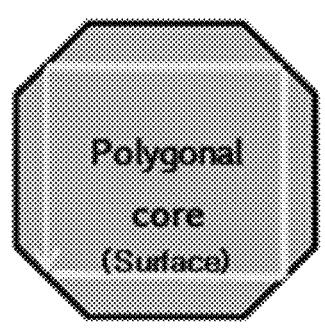
(b1)　　　　　(b2)　　　　　(b3)

[FIG. 13a]
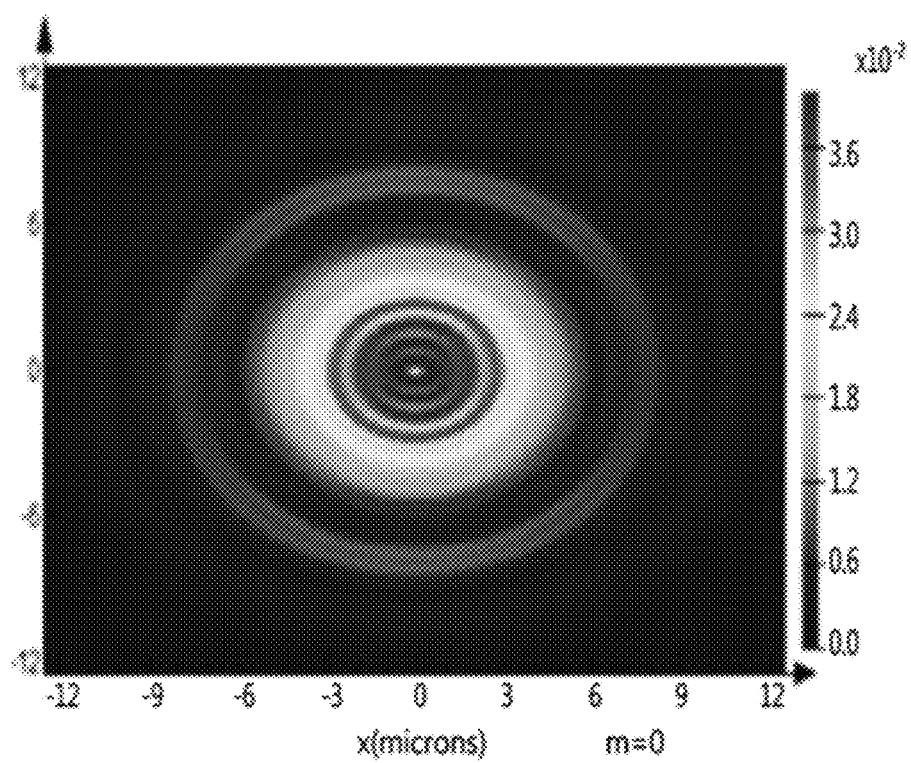

[FIG. 13b]
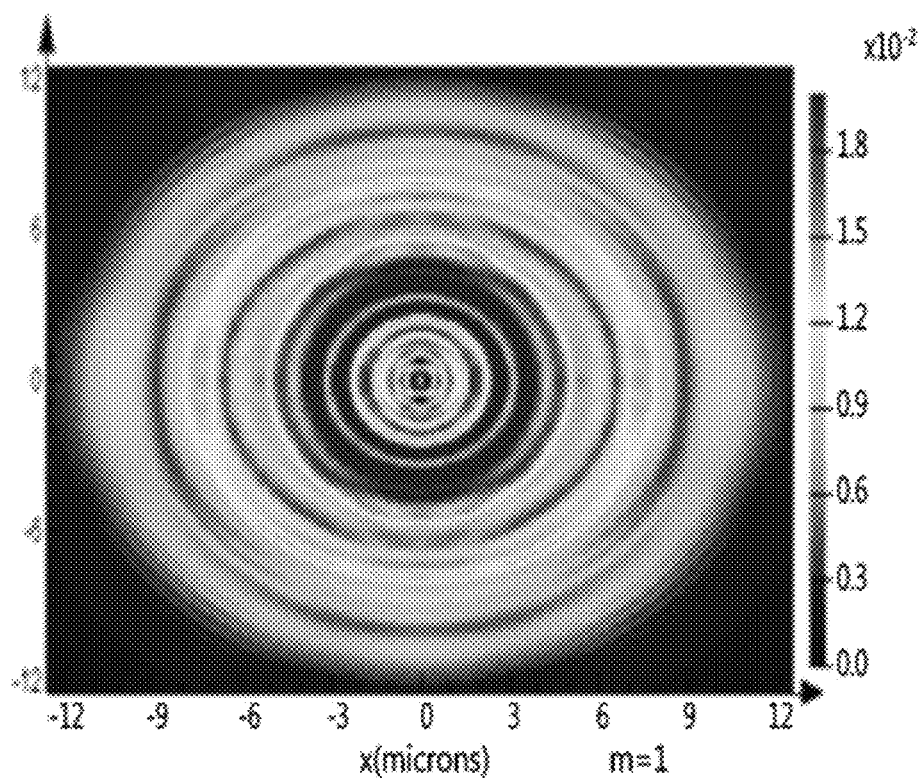

[FIG. 14a]
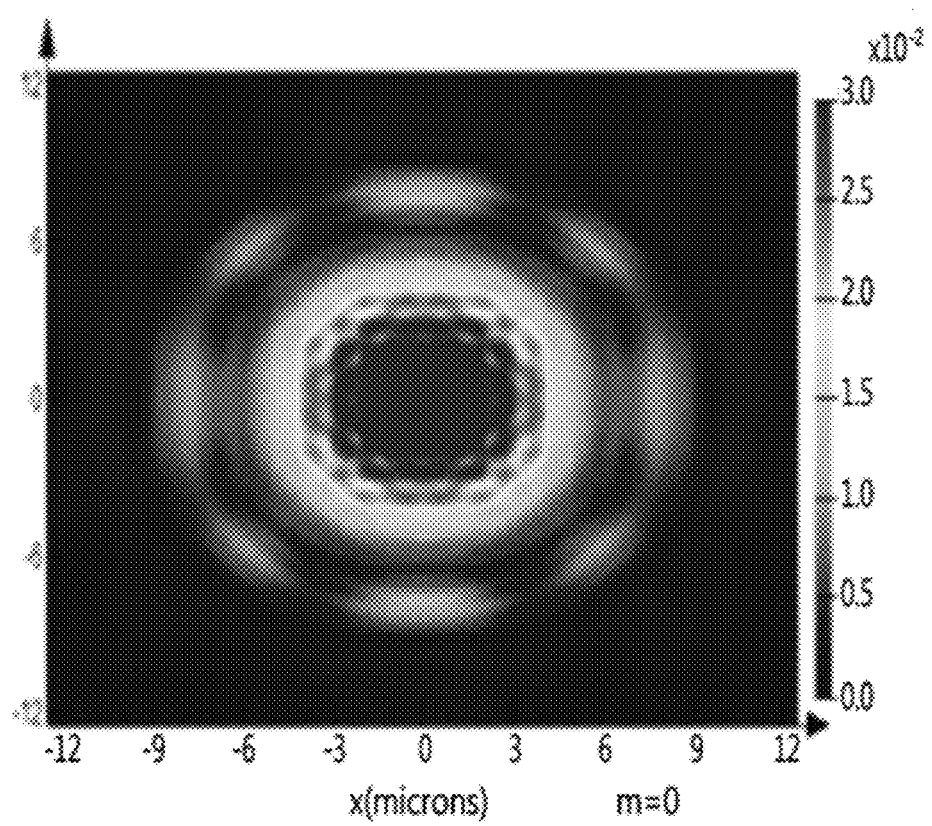

[FIG. 14b]
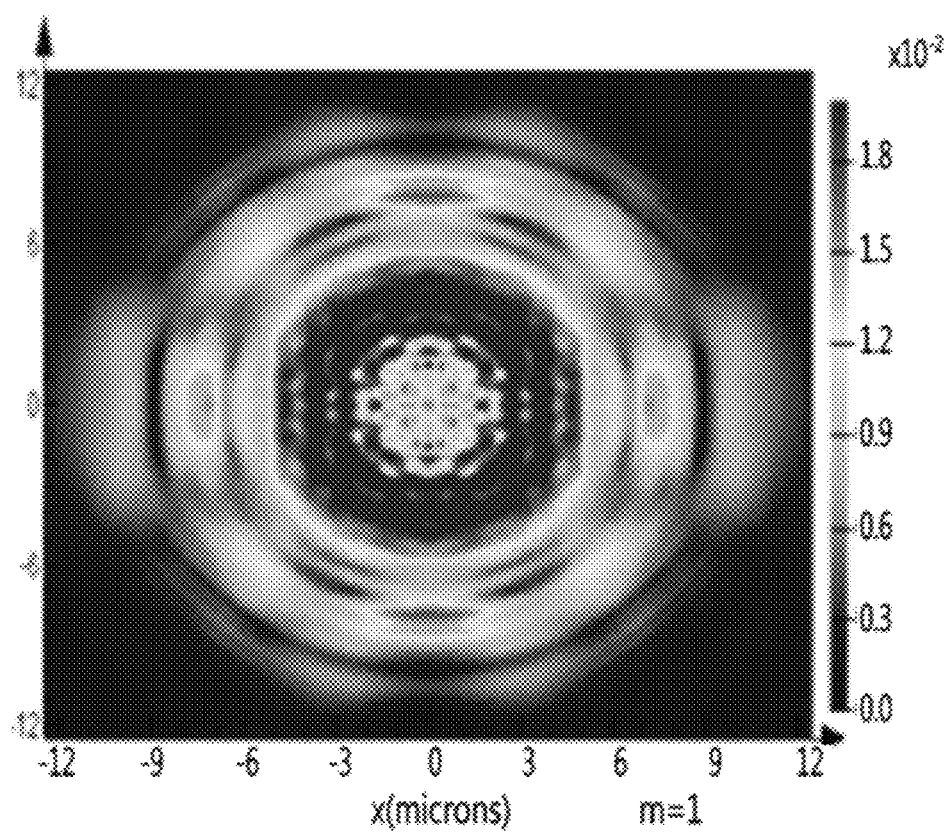

[FIG. 15]
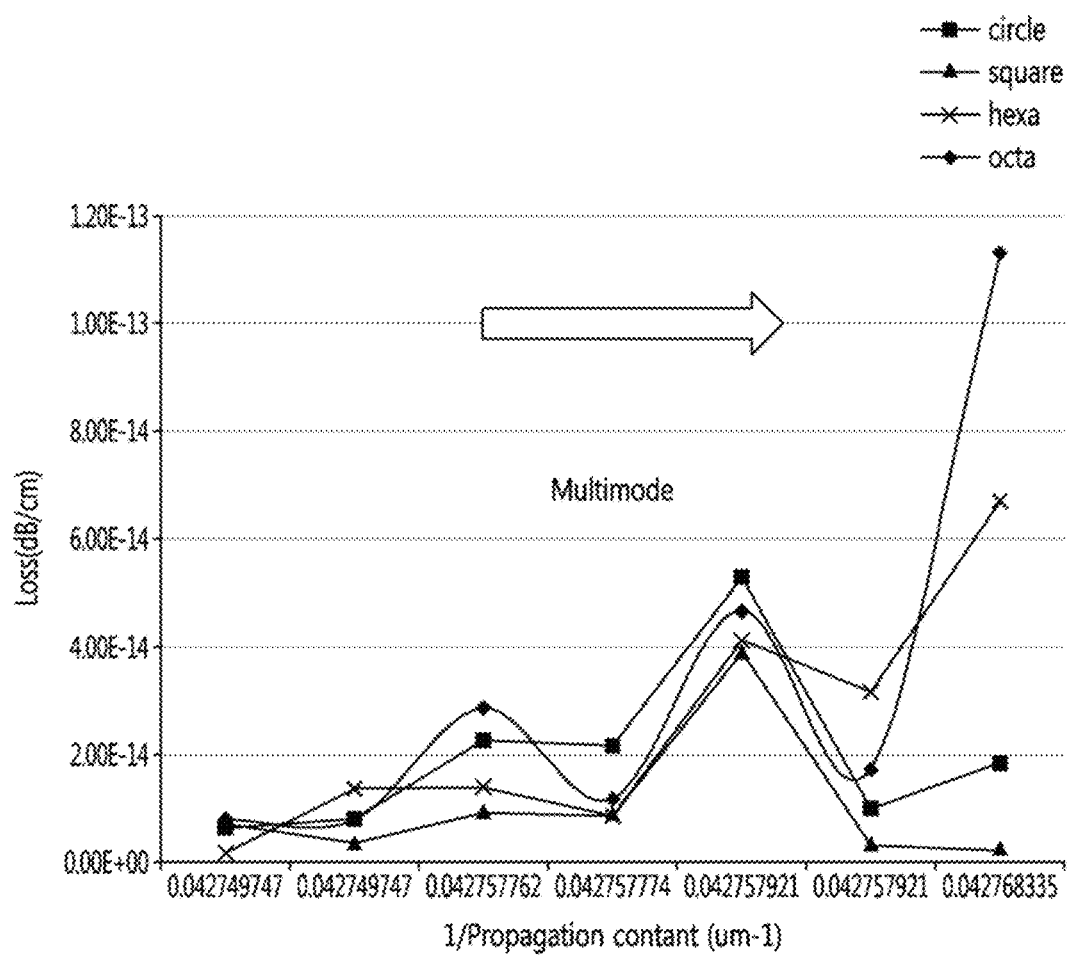

[FIG. 16a]
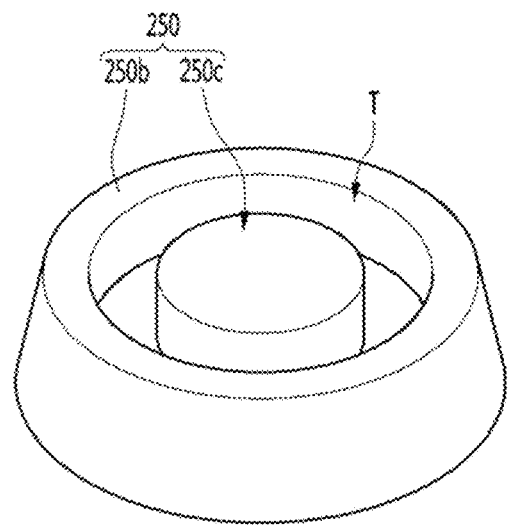
[FIG. 16b]
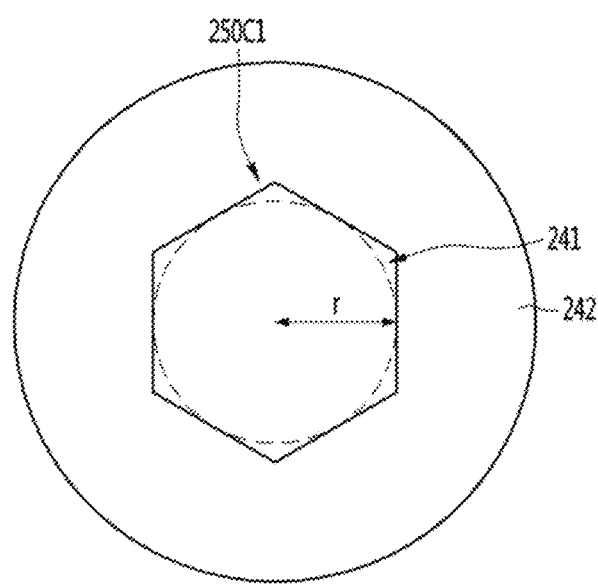

[FIG. 16c]
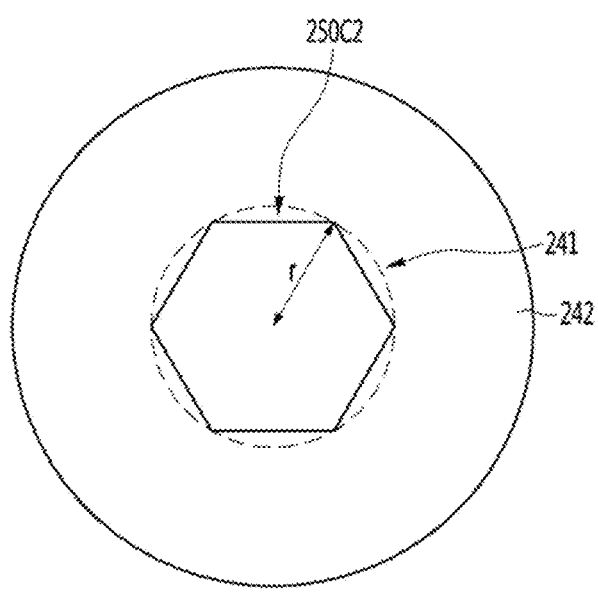
[FIG. 17a]
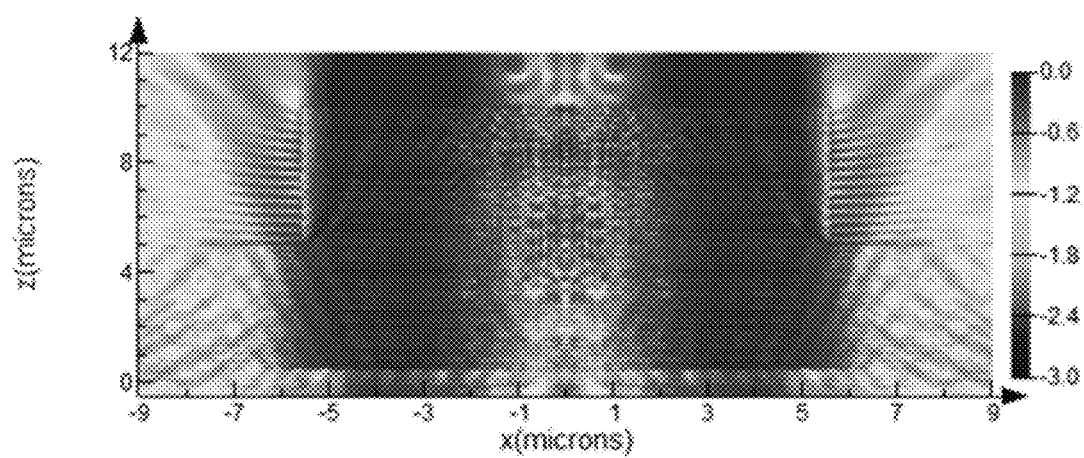

[FIG. 17b]
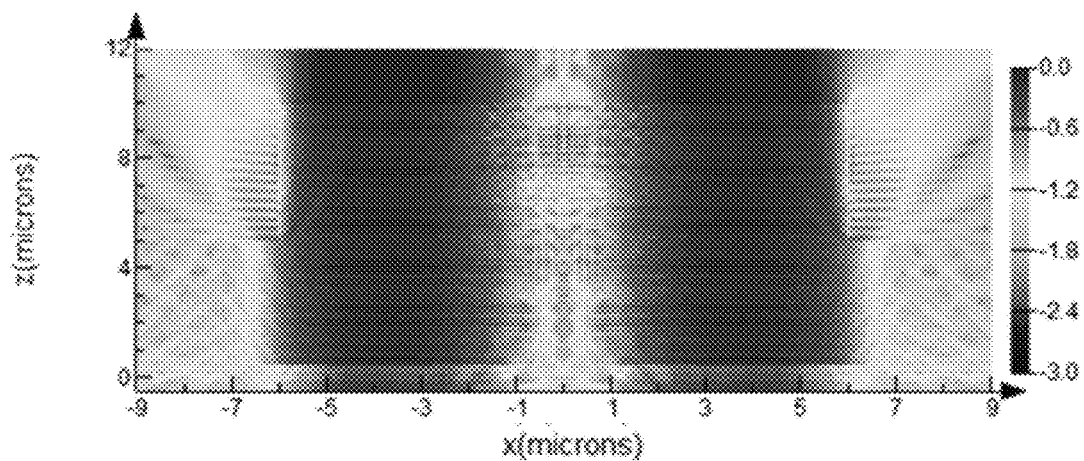
[FIG. 18]
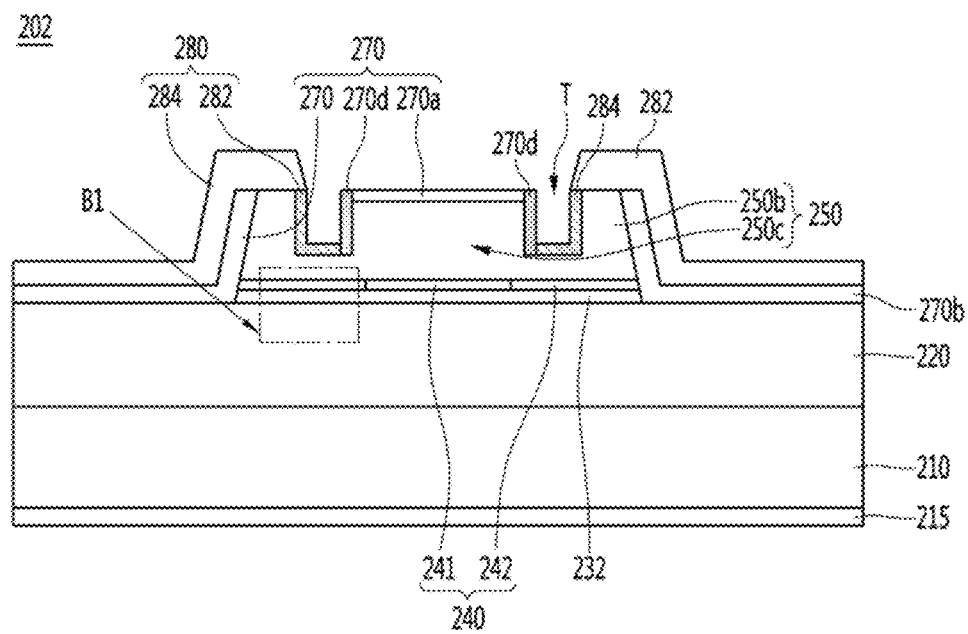

[FIG. 19]
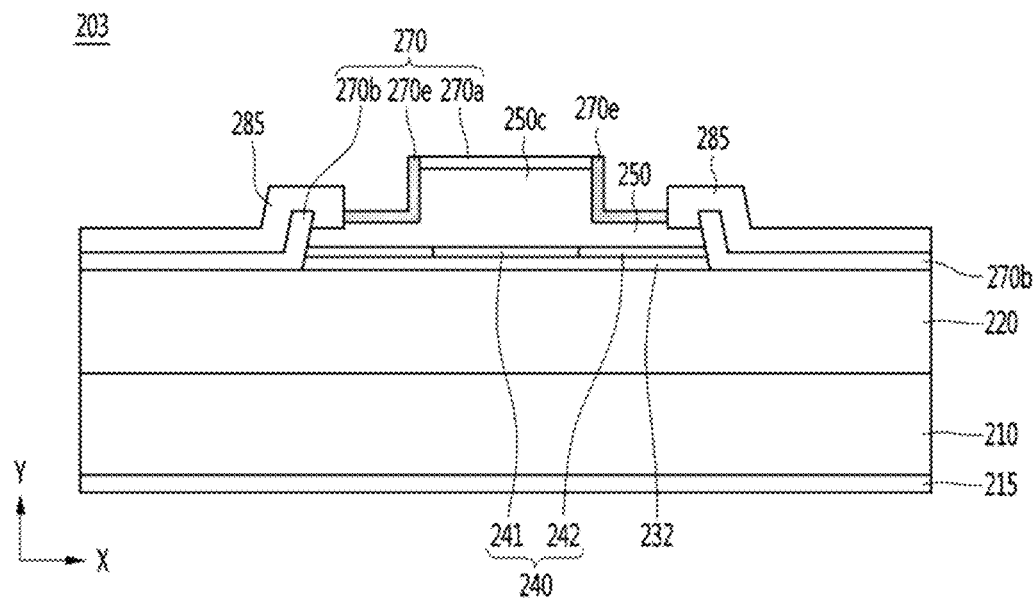
[FIG. 20]
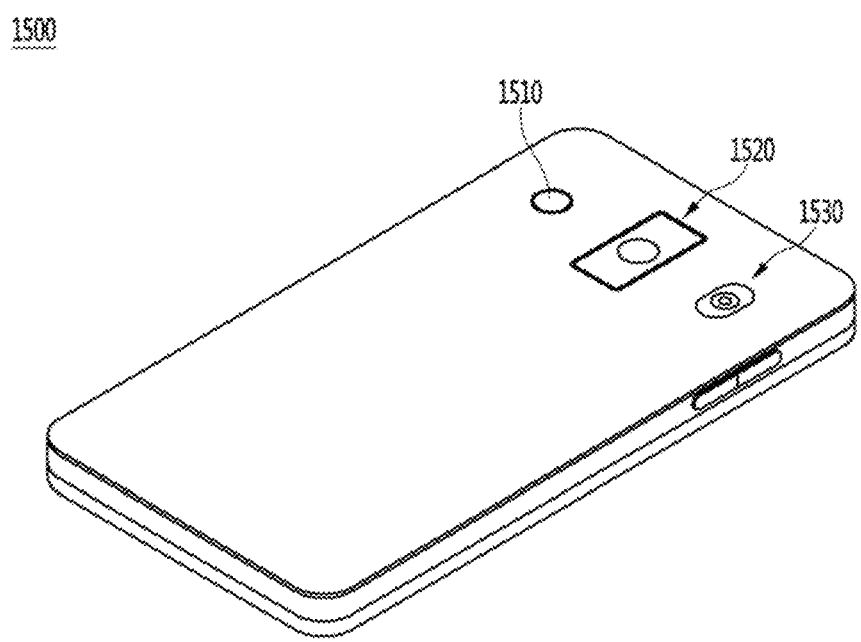

SURFACE EMITTING LASER DEVICE AND A LIGHT EMITTING DEVICE INCLUDING THE SAME

CROSS REFERENCE TO RELATED APPLICATIONS

This application is the National Phase of PCT International Application No. PCT/KR2019/014329, filed on Oct. 29, 2019, which claims priority under 35 U.S.C. 119(a) to Patent Application No. 10-2018-0131802, filed in the republic of Korea on Oct. 31, 2018, all of which are hereby expressly incorporated by reference into the present application.

TECHNICAL FIELD

The embodiment relates to a semiconductor device, and more particularly, to a surface emitting laser device and a light emitting device including the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light-emitting diode backlight is replacing a cold cathode fluorescent lamp (CCFL) constituting a transmission module of an optical communication means and a backlight of a liquid crystal display (LCD) display device. Applications are expanding to white light-emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface-emitting laser (VCSEL), which is used for optical communication, optical parallel processing, and optical connection. On the other hand, in the case of a laser diode used in such a communication module, it is designed to operate at a low current.

Meanwhile, response speed was important in the existing structure for data optical communication, but as it is recently applied to a high power PKG for a sensor, optical output and voltage efficiency become important characteristics.

For example, a 3D sensing camera is a camera capable of capturing depth information of an object, and has recently been in the spotlight in conjunction with augmented reality. On the other hand, for sensing the depth of the camera module, a separate sensor is mounted, and it is divided into two types: Structured Light (SL) method and Time of Flight (ToF) method.

In the structured light (SL) method, a laser of a specific pattern is radiated onto a subject, and the depth is calculated by analyzing the degree of deformation of the pattern according to the shape of the subject surface, and then combining it with a picture taken by an image sensor to obtain a 3D photographing result.

In contrast, the ToF method is a method in which a 3D photographing result is obtained by calculating the depth by measuring the time the laser is reflected off the subject and returning, and then combining it with the picture taken by the image sensor.

Accordingly, the SL method has an advantage in mass production in that the laser must be positioned very accurately, while the ToF technology relies on an improved image sensor, and it is possible to adopt either method or both methods in one mobile phone.

For example, a 3D camera called True Depth can be implemented in the front of a mobile phone in the SL method, and the ToF method can be applied in the rear.

Meanwhile, when a VCSEL is applied to a structured light sensor, a time of flight (ToF) sensor, or a laser diode autofocus (LDAF), it operates at a high current. Accordingly, problems such as a decrease in luminous intensity output or an increase in threshold current occur.

As described above, in the VCSEL package technology, the ToF method extracts Depth by calculating the time difference of the reflected pulse beam by the flash-type pulse projection through the VCSEL chip as a light source and the diffuser.

For example, FIG. 1A is an exemplary diagram of a method of determining a field of interest (FOI) and a field of view (FOV) by a combination of beam divergence and diffuser beam angle in a VCSEL chip. Accordingly, it is important to control the beam divergence in the VCSEL chip to determine the FOI and FOV.

Next, FIG. 2A shows mode change data according to an aperture size in the related art.

In the related art, the aperture size is increasing in accordance with the demand for a high-output VCSEL package.

In VCSEL technology, a small size aperture, for example, an aperture of 3 μm or less in diameter ($r_A$) is desirable for single fundamental mode stabilization, but a large size aperture in a high-power VCSEL package (large size aperture) is required.

On the other hand, as shown in FIG. 2A, when the aperture size, for example, the diameter $r_A$ of the aperture increases, a problem occurs in that the light emission mode changes or the divergence angle changes due to mode hopping.

Specifically, referring to FIG. 2A, when the aperture diameter $r_A$ increases, the divergence mode changes, so that a higher mode shift occurs.

For example, as the aperture size increases in the related art, $LP_{01}$ ($r_A=2$ μm), $LP_{21}$ ($r_A=4$ μm), $LP_{41}$ ($r_A=6$ μm) changes to higher mode, such that higher mode shift phenomenon occurs.

However, this change in higher-order mode causes the problem of the beam pattern splitting or increasing the divergence angle of beams, and the increase in the divergence angle does not satisfy the set FOI and FOV.

For example, FIG. 2B shows beam profile data in a far field of a conventional VCSEL, and a beam pattern of an outgoing beam is fragmented with an increase in applied current. For example, FIG. 2B shows that in a VICEL having an aperture having a circular aperture diameter ($r_A$) of 4.5 μm under the condition that the threshold current ($I_{th}$) is 1.2 mA, it can be seen that the oscillation mode changes to a higher-order mode as the oscillation mode increases 1.2 mA (b1) to 3.0 mA (b2) and 5.0 mA (b3) respectively, resulting in a problem that the beam pattern of the exit beam is split.

Meanwhile, FIG. 2C shows beam profile data in a far field of a conventional VCSEL, and when the aperture diameter $r_A$ is 6.0 μm, it is oscillated in a higher-order mode immediately after lasing. In addition, as the current increases, multi-mode oscillation has become more intense.

On the other hand, in this application, the far field beam profile of the surface emitting laser device was measured using a beam profiler measuring instrument 8050M-GE-TE (Thorlabs, Inc.) (8050M-GE-TE specification information: 8 Megapixels, Monochrome Scientific CCD Camera, Hermetically Sealed Cooled Package, GigE Interface). However, the measuring equipment of the far field beam profile is not limited thereto.

Next, FIG. 3 shows near field image data according to an increase in applied current in a conventional VCSEL, and also shows data of a divergence angle of beams according to each applied current. Referring to FIG. 3, as the applied current increases from 3 mA (d1) to 5 mA (d2), 7.5 mA (d3) and 12 mA (d4), the divergence angle of beams increases sharply to 21.0°, 25.0°, 27.0° and 31.0° respectively.

That is, according to the related art, when high current is applied, current crowding at the aperture edge may cause damage to the aperture which is a laser emission area. An optical problem occurs in that while the dominant mode oscillates at a low current, but the divergence angle of beams increases due to the higher mode oscillation as a high current is applied.

In particular, according to the related art, there is a problem in that the wavelength and the angle of divergence change due to the divergence mode hopping. However, in order to stabilize the divergence mode, the diameter of the aperture is preferably less than about 5.0 μm. However, a large aperture is required for high output, but a technical contradiction arises in that divergence angle of beams increases due to instability of the oscillation mode in a larger aperture of 5.0 μm or more.

Next, FIGS. 4A and 4B are simulation data obtained by analyzing the progress of light for each transverse mode in the conventional VCSEL structure. FIG. 4A is single mode data, and FIG. 4B is a multi-mode data.

In the related art, a VCSEL having a circular mesa structure using an oxide layer as an insulating layer has a higher order transverse mode when driven with a high current, so that there is a problem in that the divergence angle increases as shown in FIG. 4B.

On the other hand, if the circular size of the oxide layer is reduced in order to suppress such a higher order mode, a current density increases, thereby causing a problem in reliability.

In the related art, the laser emitted through the aperture is emitted through the DBR reflective layer. However, since the difference in refractive index between the waveguide core and the cladding layer through which the laser passes in the DBR reflective layer is small, a problem in which loss occurs due to the oxidation layer occurs in particular.

DISCLOSURE

Technical Problem

The embodiment is intended to provide a surface emitting laser device and a light emitting device including the same, capable of preventing the problem of increasing the divergence angle of beams or splitting the beam pattern according to the higher mode shift despite the application of a high current or an increase in the aperture size.

Technical Solution

The surface emitting laser device according to the embodiment may include a first reflective layer 220, an active layer 232 on the first reflective layer 220, and an active region 240 disposed on the active layer 232, including an aperture 241, and an insulating region 242 disposed around a periphery 241 of the aperture 241, and a second reflective layer 250 on the active region 240.

The second reflective layer 250 may include a core reflective layer 250c vertically disposed at a position corresponding to the aperture 241.

The embodiment may include a cladding insulating layer 270c disposed around the core reflective layer 250c.

The horizontal cross-section of the aperture 241 and the horizontal cross-section of the core reflective layer 250c may be different from each other.

The cladding insulating layer 270c may be disposed at a position perpendicular to the insulating region 242.

The second reflective layer 250 may include a trench region T in which a portion of an upper surface thereof is partially removed in a circular shape.

The second reflective layer 250 may include the core reflective layer 250c remaining inside the trench area and an outer reflective layer 250b remaining outside the trench area.

The cladding insulating layer 270c may be disposed in the trench region T.

The embodiment may include an outer insulating layer 270b disposed on the outer reflective layer 250b and an upper insulating layer 270a disposed on the core reflective layer 250c.

Air may be disposed in the trench region T.

The aperture 241 may include a first horizontal cross-section, and the core reflective layer 250c may include a second horizontal cross-section different from the first horizontal cross-section.

The aperture 241 may include a circular first horizontal cross-section, and the core reflective layer 250c may include a polygonal second horizontal cross-section.

The inner periphery of the insulating region 242 may include a circular horizontal cross section.

The circular first horizontal cross-section of the aperture 241 may circumscribe the polygonal second horizontal cross-section of the core reflective layer 250c.

The circular first horizontal cross-section of the aperture 241 may be inscribed with respect to the polygonal second horizontal cross-section of the core reflective layer 250c.

The second polygonal horizontal cross-section of the core reflective layer 250c may include a hexagonal or octagonal horizontal cross-section.

The cladding insulating layer 270c may include air or an insulating material.

The surface emitting laser device according to another embodiment may include a first reflective layer 220, the active layer 232 on the first reflective layer 220, and an active region 240 disposed on the active layer 232, including an aperture 241, and an insulating region 242 disposed around the aperture 241 and a second reflective layer 250 on the active region 240.

The second reflective layer 250 may include a core reflective layer 250c vertically disposed at a position corresponding to the aperture 241.

The embodiment may include second cladding insulating layers 270d and 270e disposed around the core reflective layer 250c and second electrodes 280 and 285 electrically connected to the second reflective layer 250.

The second reflective layer 250 includes a trench region T in which a portion of the upper surface thereof is partially removed in a circular shape, and the second cladding insulating layer 270d is disposed on one sidewall of the trench region T. The second electrode 280 may include a second contact electrode 282 disposed on the other sidewall of the trench region T.

The cladding insulating layer 270c is disposed at a position vertically corresponding to the insulating region 242, the aperture 241 includes a first horizontal cross-section, and the core reflective layer 250c may include a second horizontal cross-section different from the first horizontal cross-section.

Advantageous Effects

The embodiment can provide a surface emitting laser device and a light emitting device including the same, capable of preventing increasing the divergence angle of beams or splitting the beam pattern according to the higher mode shift when a high current is applied or despite an increase in the aperture size.

In particular, according to the embodiment, the DBR reflective layer through which the laser passes can function as a waveguide core, and by disposing a cladding layer having a large difference in refractive index on the outside thereof, there is a special technical effect of preventing the occurrence of loss due to the oxidation layer.

In addition, according to the surface emitting laser device according to the embodiment, there is a technical effect capable of improving light extraction efficiency.

For example, after the single mode as shown in FIG. 8A, it may be driven with a high current as shown in FIG. 8B to be driven in multi-mode. In the case of driving in a multi-mode, loss due to the insulating region 242, which is an oxidation layer, can be reduced by the cladding insulating layer 270c disposed in the trench region T formed by etching the second reflective layer 250 such that the embodiment allows for better light extraction and has a technical effect in which the divergence angle hardly increases.

Next, according to the embodiment, there is a special technical effect of reducing the divergence angle by allowing light to collect when it comes out to the surface by the formation of the trench region T.

For example, according to the embodiment, when a polygonal trench is formed on the surface of the second reflective layer 250 through etching, the light is reflected from the surface and the light is collected to the center of the core reflective layer 250c. Through this, after a single mode as shown in FIG. 11A, even in a multi-mode as shown in FIG. 11B, as light gathers to the center of the core reflective layer 250c and proceeds such that there is a special technical effect of reducing the divergence angle.

For example, there is an effect that the polygonal core of the embodiment is reduced than the core of the circular structure of the second comparative example, and accordingly, there is a special technical effect of performing a function of suppressing a higher mode.

Accordingly, according to the embodiment, there is a complex technical effect of improving light extraction, suppressing higher-order modes, and reducing the beam angle through surface polygonal etching. For example, according to the surface emitting laser device in the embodiment, since light extraction is higher by reducing light loss in an insulating region, there is a technical effect of generating higher power with the same current. In addition, according to the embodiment, there is a technical effect of suppressing a higher-order mode that deteriorates the driving characteristics of the surface emitting laser device. Further, according to the embodiment, there is a technical effect of reducing the divergence angle by collecting light through etching.

In addition, according to the embodiment, the second cladding insulating layer 270d may be disposed to surround the core reflective layer 250c. Accordingly, according to the embodiment, light loss can be reduced to maximize light extraction efficiency, and at the same time, the second contact electrode 282 is in electrical ohmic contact with the second reflective layer 250 exposed in the trench region T. Accordingly, there is a complex technical effect that can significantly improve the luminous efficiency by improving the electrical characteristics.

In addition, according to the embodiment, the second cladding insulating layer 270d is disposed so as to surround the core reflective layer 250c to reduce light loss, thereby maximizing light extraction efficiency. In addition, according to the embodiment, there is a special technical effect that can increase the efficiency and reliability of the process by not leaving a separate outer reflective layer 250b. In addition, according to the embodiment, as the third contact electrode 285 is in electrical ohmic contact with the exposed second reflective layer 250, electrical characteristics are improved, and thus luminous efficiency may be remarkably improved.

DESCRIPTION OF DRAWINGS

FIG. 1 is an exemplary diagram of a method of determining a field of interest (FOI) and a field of view (FOV) by a combination of a beam divergence and a diffuser beam angle in a VCSEL chip.

FIG. 2a is a mode change data according to the aperture size in the related art.

FIG. 2B is a beam profile data in a far field according to an increase in an applied current of a conventional VCSEL.

FIG. 2C is a beam profile data in a far field when the aperture diameter $r_A$ of a conventional VCSEL is about 6.0 μm.

FIG. 3 is a near field image data according to an increase in applied current and data of a divergence angle of beams according to each applied current in a conventional VCSEL.

FIGS. 4A and 4B are simulation data obtained by analyzing the progress of light for each transverse mode in a conventional VCSEL structure.

FIG. 5 is a cross-sectional view of a surface emitting laser device according to a first embodiment.

FIG. 6 is an enlarged view of a first area B1 of the surface emitting laser device according to the first embodiment illustrated in FIG. 5.

FIGS. 7A to 7E are cross-sectional views of a manufacturing process of the surface emitting laser device according to the first embodiment.

FIGS. 8A and 8B are simulation data obtained by analyzing the progress of light for each transverse mode of the surface emitting laser device according to the embodiment.

FIGS. 9A and 9B are beam profile data in a single mode and a multi-mode in a cross section of the VCSEL of the first comparative example.

FIGS. 10A and 10B are beam profile data in a single mode and a multi-mode in a cross section of a VCSEL of a second comparative example.

FIGS. 11A and 11B are beam profile data in a single mode and a multi-mode in a cross section of a surface emitting laser device according to an embodiment.

FIG. 12A is a near field image and effective index data in the related art.

FIG. 12B is a near field image and effective index data in an embodiment.

FIGS. 13A and 13B are near field images in a single mode and a multi-mode in the VCSEL of the second comparative example.

FIGS. 14A and 14B are near field images in a single mode and a multi-mode in the surface emitting laser device according to the embodiment.

FIG. 15 is data of loss according to a transverse mode according to a cross-sectional shape of a mesa in a surface emitting laser device according to an embodiment.

FIG. 16A is a perspective view of a second reflective layer 250 and a trench region T of a surface emitting laser device according to an embodiment.

FIG. 16B is a first top view of the first core reflective layer 250C1 and the aperture 241 of the surface emitting laser device according to the embodiment shown in FIG. 16A.

FIG. 16C is a second top view of the second core reflective layer 250C2 and the aperture 241 of the surface emitting laser device according to the embodiment illustrated in FIG. 16A.

FIGS. 17A and 17B are results of simulations of structures of a first core reflective layer inscribed and a core reflective layer circumscribed based on an octagonal polygonal core reflective layer.

FIG. 18 is a cross-sectional view of a surface emitting laser device according to a second embodiment.

FIG. 19 is a cross-sectional view of a surface emitting laser device according to a third embodiment.

FIG. 20 is a perspective view of a mobile terminal to which a surface emitting laser device is applied according to an embodiment.

MODE FOR INVENTION

Hereinafter, embodiments that can be realized specifically for solving the above problems will be described with reference to the accompanying drawings.

In the description of the embodiment, in the case where it is described as being formed in "upper or lower (on or under)" of each element, both elements are in direct contact with each other or one or more other elements can be formed indirectly between the two elements. In addition, when expressed as "on or under", the meaning of not only an upward direction but also a downward direction based on one element may be included.

First Embodiment

FIG. 5 is a cross-sectional view of the surface emitting laser device 210 according to the first embodiment, and FIG. 6 is an enlarged view of a first area B1 of the surface emitting laser device 201 according to the first embodiment shown in FIG. 5.

The surface emitting laser device 201 according to the first embodiment includes a first electrode 215, a substrate 210, a first reflective layer 220, an active layer 232, an aperture region 240, and a second reflective layer 250, a second electrode 280, and a passivation layer 270.

The Aperture region 240 may include an aperture 241 and an insulating area 242. The insulating region 242 may be referred to as an oxide layer, and the aperture region 240 may be referred to as an oxide region, but is not limited thereto.

The second reflective layer 250 may include a core reflective layer 250c and an outer reflective layer 250b, and the passivation layer 270 includes an outer insulating layer 270b, an upper insulating layer 270a, and a cladding insulating layer 270c, and each specific configuration thereof will be described later.

For example, the surface emitting laser device 201 according to the first embodiment may include a first reflective layer 220, the active layer 232 on the first reflective layer 220, and an active region 240 on the active layer 232, including an aperture 241 and an insulating region 242 disposed around the aperture 241 and a second reflective layer 250 on the active region 240. The second reflective layer 250 may include a core reflective layer 250c vertically disposed at a position corresponding to the aperture 241. The embodiment may include a cladding insulating layer 270c disposed around the core reflective layer 250c.

Hereinafter, the technical features of the surface emitting laser device 201 according to the embodiment will be described with reference to FIGS. 5 and 6, and technical effects will be described with reference to the drawings. In the drawings of the embodiment, the x-axis direction may be a direction parallel to the length direction of the substrate 210, and the y-axis may be a direction perpendicular to the x-axis.

<Substrate, First Electrode>

Referring to FIG. 5, in an embodiment, the substrate 210 may be a conductive substrate or a non-conductive substrate. When a conductive substrate is used, a metal having excellent electrical conductivity can be used, and since it can sufficiently dissipate heat generated when the surface emitting laser device 201 is operated, a GaAs substrate with high thermal conductivity, a metal substrate or etc. can be used.

When using a non-conductive substrate, an AlN substrate, a sapphire ($Al_2O_3$) substrate, or a ceramic-based substrate may be used.

In an embodiment, the first electrode 215 may be disposed under the substrate 210, and the first electrode 215 may be disposed as a single layer or multiple layers of a conductive material. For example, the first electrode 215 may be a metal, and at least one of aluminum (Al), titanium (Ti), chromium (Cr), nickel (Ni), copper (Cu), and gold (Au). And the first electrode 215 can be formed in a single-layer or multi-layer structure to improve electrical properties, thereby increasing light output.

<First Reflective Layer, Second Reflective Layer>

Referring to FIG. 6, the first reflective layer 220 may be doped with a first conductivity type dopant. For example, the first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

For example, as shown in FIG. 6, the first reflective layer 220 includes a first group first reflective layer 221 disposed on a substrate 210 and a second group first reflective layer 222 disposed on the first group first reflective layer 221.

The first group first reflective layer 221 and the second group first reflective layer 222 may include a plurality of layers made of a semiconductor material having a composition formula of $Al_xGa_{(1-x)}As(0<x<1)$. If Al in each layer increases, the refractive index of each layer decreases, and when Ga increases, the refractive index of each layer may increase.

In addition, the thickness of each layer may be $\lambda/4n$, $\lambda$ may be a wavelength of light generated in the active region 230, and n may be a refractive index of each layer with respect to the above-described light of the wavelength. Here, $\lambda$ may be 650 to 980 nanometers (nm), and n may be the refractive index of each layer. The first reflective layer 220 having such a structure may have a reflectance of 99.999% for light in a wavelength region of about 940 nanometers.

The thickness of the layer in each of the first reflective layers 220 may be determined according to a respective refractive index and a wavelength $\lambda$ of light emitted from the active region 230.

In addition, as shown in FIG. 6, the first group first reflective layer 221 and the second group first reflective layer 222 may be formed of a single layer or a plurality of layers, respectively.

For example, the first group first reflective layer 221 may include about 30 to 40 pairs of the first group first-first layer 221a and the first group first-second layer 221b. The first group first-first layer 221a may be formed to be thicker than the first group first-second layer 221b. For example, the first group first-first layer 221a may be formed to be about 40 to 60 nm, and the first group first-second layer 221b may be formed to be about 20 to 30 nm.

In addition, the second group first reflective layer 222 may also include about 5 to 15 pairs of the second group first-first layer 222a and the second group first-second layer 222b. The second group first-first layer 222a may be formed to be thicker than the second group first-second layer 222b. For example, the second group first-first layer 222a may be formed to be about 40 to 60 nm, and the second group first-second layer 222b may be formed to be about 20 to 30 nm.

Next, as shown in FIG. 6, the second reflective layer 250 may include a gallium-based compound, for example, AlGaAs, and the second reflective layer 250 may be doped with a second conductivity type dopant. The second conductivity-type dopant may be a p-type dopant such as Mg, Zn, Ca, Sr, Ba, or the like. Meanwhile, the first reflective layer 220 may be doped with a p-type dopant, or the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

Each layer of the second reflective layer 250 may include AlGaAs, and in detail, may be made of a semiconductor material having a composition formula of $Al_xGa_{(1-x)}As$ $(0<x<1)$. Here, when Al increases, the refractive index of each layer decreases, and when Ga increases, the refractive index of each layer may increase. In addition, the thickness of each layer of the second reflective layer 250 is $\lambda/4n$, $\lambda$ may be a wavelength of light emitted from the active layer, and n may be a refractive index of each layer with respect to the light of the above-described wavelength.

The second reflective layer 250 having such a structure may have a reflectance of 99.9% for light in a wavelength region of about 940 nanometers.

The second reflective layer 250 may be formed by alternately stacking layers, and the number of pairs of layers in the first reflective layer 220 may be greater than the number of pairs of layers in the second reflective layer 250. In this case, as described above, the reflectance of the first reflective layer 220 is about 99.999%, which may be greater than the reflectance of 99.9% of the second reflective layer 250.

In an embodiment, the second reflective layer 250 may include a first group second reflective layer 251 disposed adjacent to the active region 230 and a second reflective layer 252 spaced apart from the active region 230 than the first group second reflective layer 251.

As shown in FIG. 6, the first group second reflective layer 251 and the second group second reflective layer 252 may also be formed of a single layer or a plurality of layers, respectively.

For example, the first group second reflective layer 251 may include about 1 to 5 pairs of the first group second-first layer 251a and the first group second-second layer 251b. The first group second-first layer 251a may be formed to be thicker than the first group second-second layer 251b. For example, the first group second-first layer 251a may be formed to be about 40 to 60 nm, and the first group second-second layer 251b may be formed to be about 20 to 30 nm.

In addition, the second group second reflective layer 252 may also include about 5 to 15 pairs of the second group second-first layer 252a and the second group second-second layer 252b. The second group second-first layer 252a may be formed to be thicker than the second group second-second layer 252b. For example, the second group second-first layer 252a may be formed to be about 40 to 60 nm, and the second group second-second layer 252b may be formed to be about 20 to 30 nm.

<Active Layer>

With continued reference to FIG. 6, the active layer 232 may be disposed between the first reflective layer 220 and the second reflective layer 250.

The active layer 232 may include any one of a single well structure, a multiple well structure, a single quantum well structure, a multi quantum well (MQW) structure, a quantum dot structure, or a quantum wire structure.

The active layer 232 may include a well layer 232a and a barrier layer 232b using a compound semiconductor material of a group III-V element. The well layer 232a may be formed of a material having an energy band gap smaller than the energy band gap of the barrier layer 232b. The active layer 232 may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

<Cavity>

In an embodiment, predetermined cavities 231 and 233 may be disposed between the first reflective layer 220 and the second reflective layer 250.

In addition, the first reflective layer 220 or the second reflective layer 250 may include the cavities 231 and 233.

The cavities of the embodiment may be disposed in contact with the upper and lower sides of the active layer 232, respectively. The cavity includes a first cavity 231 disposed between the active layer 232 and the first reflective layer 220 and a second cavity 233 disposed between the active layer 232 and the second reflective layer 250.

The first cavity 231 and the second cavity 233 may be formed of an $Al_yGa_{(1-y)}As$ (0<y<1) material, but are not limited thereto. For example, the first cavity 231 and the second cavity 233 may each include a plurality of layers of $Al_yGa_{(1-y)}As$.

For example, the first cavity 231 may include a first-first cavity layer 231a and a first-second cavity layer 231b. The first-first cavity layer 231a may be further spaced apart from the active layer 232 compared to the first-second cavity layer 231b. The first-first cavity layer 231a may be formed to be thicker than the first-second cavity layer 231b, but is not limited thereto.

In addition, the second cavity 233 may include a second-first cavity layer 233a and a second-second cavity layer 233b. The second-second cavity layer 233b may be further spaced apart from the active layer 232 compared to the second-first cavity layer 233a. The second-second cavity layer 233b may be formed to be thicker than the second-first cavity layer 233a, but is not limited thereto. In this case, the second-second cavity layer 233b may be formed to be about 60 to 70 nm, and the first-first cavity layer 231a may be formed to be about 40 to 55 nm, but the present invention is not limited thereto.

<Aperture Region>

Referring back to FIG. 5, in an embodiment, the aperture region 240 may include an insulating region 242 and an aperture 241. The aperture 241 may be referred to as an opening, and the aperture region 240 may be referred to as an opening region.

The insulating region 242 may be formed of an insulating layer, for example, aluminum oxide, and may function as a current blocking region, and an aperture 241 that is a light emission region may be defined by the insulating region 242.

For example, when the aperture region 240 includes aluminum gallium arsenide (AlGaAs), the AlGaAs of the aperture region 240 reacts with $H_2O$ and the edge is changed to aluminum oxide ($Al_2O_3$). Accordingly, the insulating region 242 may be formed, and the central region that does not react with $H_2O$ may be an aperture 241 made of AlGaAs.

According to the embodiment, light emitted from the active region 230 through the aperture 241 may be emitted to the upper region, and the aperture 241 may have excellent light transmittance compared to the insulating region 242.

Referring to FIG. 6 for a moment, the insulating region 242 may include a plurality of layers, for example, the insulating region 242 includes a first insulating layer 242a and a second insulating layer 242b. The first insulating layer 242a may have a thickness equal to or different from that of the second insulating layer 242b.

<Second Electrode, Passivation Layer>

Referring back to FIG. 5, the surface emission laser device 201 according to the embodiment may be mesa etched from the second reflective layer 250 to the aperture region 240, the active region 230 to define an emitter. Also, a part of the first reflective layer 220 may be mesa etched.

Thereafter, the second electrode 280 may be disposed on the second reflective layer 250, and the second electrode 280 may include a first pad electrode 281a and a first contact electrode 281b. The first contact electrode 281b may improve ohmic contact characteristics between the second reflective layer 250 and the first pad electrode 281a.

The second electrode 280 may be made of a conductive material, for example, a metal. For example, the second electrode 280 includes at least one of aluminum (Al), titanium (Ti), chromium (Cr), nickel (Ni), copper (Cu), and gold (Au). It can be formed into a structure. The first contact electrode 281b may be formed of the same material as the material of the first pad electrode 281a, but is not limited thereto.

The embodiment may include a passivation layer 270 disposed on the second reflective layer 250.

For example, the passivation layer 270 may include an outer insulating layer 270b and an upper insulating layer 270a respectively disposed on side and upper surfaces of the mesa-etched light emitting structure. Meanwhile, in an embodiment, the passivation layer 270 may include a cladding insulating layer 270c at a position vertically corresponding to the insulating region 242 of the aperture region 240.

The passivation layer 270 may be disposed on a side surface of the surface emitting laser device 201 separated by device units, to protect and insulate the surface emitting laser device 201. The passivation layer 270 may be made of an insulating material, for example, a nitride or an oxide. For example, the passivation layer 270 may include at least one of polyimide, silica ($SiO_2$), or silicon nitride ($Si_3N_4$). The outer insulating layer 270b, the upper insulating layer 270a, and the cladding insulating layer 270c may be formed of the same material, but are not limited thereto.

Hereinafter, technical features of the surface emitting laser device 201 according to the first embodiment will be described in detail with reference to FIGS. 5 and 7A to 7E. In this case, FIGS. 7A to 7E are cross-sectional views of a manufacturing process of the surface emitting laser device 201 according to the first embodiment shown in FIG. 5.

First, referring to FIG. 7A, as described above, after forming a first reflective layer 220, an active layer 232, a preliminary active region layer (not shown), and a second reflective layer 250 on the substrate 210, the active region 240 including the insulating region 242 and the aperture 241 may be formed by the oxidation process.

Thereafter, the emitter may be defined by mesa etching from the second reflective layer 250 to the aperture region 240 and the active layer 232. Also, a part of the first reflective layer 220 may be mesa etched.

Next, as shown in FIG. 7B, by partially etching the second reflective layer 250 to form a trench region T, the core reflective layer 250c and the outer reflective layer 250b may be formed. The process of forming the trench region T may be performed by dry etching or wet etching, but is not limited thereto.

The second reflective layer 250 vertically overlapping the aperture 241 by the trench region T forming process may be referred to as the core reflective layer 250c, and the region remaining outside the trench region T may be referred to as the reflective layer 250b.

FIG. 7C is a partial perspective view of the second reflective layer 250 and the trench region T illustrated in FIG. 7B. In FIG. 7B, the second reflective layer 250 and the trench region T may correspond to a cross-sectional view taken along line A2-A2' in the partial perspective view shown in FIG. 7C. A side surface of the outer reflective layer 250b may include an inclined side surface. For example, the width may increase in the direction of the active layer 232 from the upper side of the second reflective layer 250, but is not limited thereto, and may be a vertical side without an inclination.

Next, as shown in FIG. 7D, a passivation layer 270 may be formed on the second reflective layer 250 in which the trench region T is formed and the exposed first reflective layer 220.

The passivation layer 270 may include an outer insulating layer 270b and an upper insulating layer 270a respectively disposed on side surfaces and upper surfaces of the mesa-etched light emitting structure.

In particular, in an embodiment, the passivation layer 270 may include a cladding insulating layer 270c at a position perpendicular to the insulating region 242 of the aperture region 240.

The cladding insulating layer 270c may be disposed in the trench region T.

In an embodiment, an outer insulating layer 270b may be disposed on the outer reflective layer 250b, and the upper insulating layer 270a may be disposed on the core reflective layer 250c.

Next, as shown in FIG. 7E, after exposing the upper surface of the second reflective layer 250 by removing a part of the passivation layer 270, the second electrode 280 may be formed.

The second electrode 280 may include a first contact electrode 281b and a first pad electrode 281a. The first contact electrode 281b may improve ohmic contact characteristics between the second reflective layer 250 and the first pad electrode 281a.

Through this, it is possible to form the surface emitting laser device 201 according to the first embodiment.

For example, the surface emitting laser device 201 according to the first embodiment may include a first reflective layer 220, the active layer 232 on the first reflective layer 220, and an active region 240 on the active layer 232, including an aperture 241 and an insulating region 242 disposed around the aperture 241 and a second reflective layer 250 on the active region 240.

In this case, the second reflective layer 250 may include a core reflective layer 250c vertically disposed at a position corresponding to the aperture 241. In addition, the embodiment may include a cladding insulating layer 270c disposed around the core reflective layer 250c.

According to the surface emitting laser device 201 according to the embodiment, there is a technical effect capable of improving light extraction efficiency.

As described above, FIGS. 4A and 4B are simulation data obtained by analyzing the progress of light in each transverse mode in the conventional VCSEL structure showing higher order transverse mode is formed, resulting in a loss of light and an increase in directivity as shown in FIG. 4B.

Meanwhile, FIGS. 8A and 8B are simulation data obtained by analyzing the progress of light for each transverse mode of the surface emitting laser device according to the embodiment.

For example, even if it is driven in a high current as shown in FIG. 8B after a single mode as shown in FIG. 8A and driven in a multi-mode, the second reflective layer 250 is formed through etching. The cladding insulating layer 270c disposed in the trench region T can reduce the loss due to the insulating region 242 which is an oxidation layer. So, there are technical effects in that the light extraction is better and the divergence angle is not increased.

For example, referring to FIG. 7E, the depth of the trench region T is formed to a depth of 50% to 95% of the thickness of the second reflective layer 250, thereby contributing to improvement of light extraction efficiency. When the depth of the trench region T is less than the lower limit, the depth of the core insulating layer 270c to be formed afterwards is low, so that it cannot sufficiently function as a cladding layer, so light may leak out. And when the depth of the trench region T is beyond the upper limit, there may be a reliability issue by damaging the active layer.

In addition, according to an embodiment, by disposing the cladding insulating layer 270c in the trench region T, the difference in refractive index from the core reflective layer 250c is increased, there is a technical effect in that a transverse optical mode in the active layer 232 can make the confinement work well. For example, FIGS. 8A and 8B are data obtained when a trench region T having a depth of about 1.5 μm with respect to the thickness of the second reflective layer 250 of about 1.6 μm is formed, but the exemplary embodiment is not limited thereto.

In addition, referring to FIG. 7E, the trench region T is constrained in the transverse optical mode in the active layer 232 by increasing the difference in refractive index from the core reflective layer 250c as air is disposed such that there is a technical effect that can make confinement work.

Next, according to the embodiment, there is a technical effect of reducing the divergence angle, which will be described in more detail.

FIGS. 9A and 9B are beam profile data in a single mode and a multi-mode in a cross section of the VCSEL of the first comparative example, and FIGS. 10A and 10B are the VCSEL of the second comparative example. It is the beam profile data in single mode and multi-mode in cross section.

For example, FIGS. 9A and 9B are a first comparative example R1 in which a trench region is not formed, and a beam profile in a multi-mode as shown in FIG. 9B after a single mode as shown in FIG. 9A. According to the beam profile, there is a problem that the beam angle increases since the emitted light cannot be collected in the center.

Next, FIGS. 10A and 10B are a second comparative example R2 when a trench region is formed, but the top view of the trench is circular. After a single mode as shown in FIG. 10A, according to a beam profile in a multi-mode as shown in FIG. 10B, although the emitted light is collected in the center, there is a problem in that the beam angle is still increased as it is not controlled.

Next, FIGS. 11A and 11B are beam profile data E in a single mode and a multi-mode in a cross section of a surface emitting laser device according to an embodiment.

According to the embodiment, when a polygonal trench is formed on the surface of the second reflective layer 250 through etching, light is reflected from the surface and the light is collected to the center of the core reflective layer 250c.

Through this, after a single mode as shown in FIG. 11A, even in a multi-mode as shown in FIG. 11B, as light gathers to the center of the core reflective layer 250c and proceeds, such that there is a special technical effect of reducing the divergence angle.

According to the embodiment, there is a technical effect of reducing the divergence angle by allowing light to collect when it comes out to the surface by the formation of the trench region T.

Meanwhile, in the trench region T, a higher-order mode is formed by making a difference in refractive index between the core reflective layer 250c and the cladding insulating layer 270c larger.

Next, according to the embodiment, there is a special technical effect of suppressing a higher-order mode due to a mismatch between two waveguide cores through a surface polygonal structure.

First, (a1) and (a2) of FIG. 12A are mode analysis data through a finite-difference time-domain (FDTD) in the related art, and are near field images and effective index data.

Next, (b1) and (b2) of FIG. 12B are mode analysis data through FDTD, which are near field images and effective index data in the embodiment.

Referring to FIG. 12A, when the second reflective layer is etched in a circular shape, the difference in refractive index between the waveguide core and the cladding increases as shown in (a2), so that light is emitted in a higher-order mode as shown in (a3).

For example, FIGS. 13A and 13B are mode analysis data through FDTD in the VCSEL of the second comparative example, and are near field images in single mode and multi-mode.

However, if the polygon is etched as shown in FIG. 12B, the polygonal core has a smaller refractive index difference than the circular core as shown in (b2), and thus the higher-order mode is suppressed as shown in (b3).

The effective index of the polygonal core in the embodiment is higher than that of the circular structure of the second comparative example. Accordingly, there is an effect of reducing the difference in refractive index (A), and thus there is a special technical effect of performing a function of suppressing a higher mode.

Next, FIGS. 14A and 14B are mode analysis data through FDTD in the surface emitting laser device according to the embodiment, respectively, as a near field image in a single mode and a multi-mode. Unlike the circular etching of the second comparative example, the polygonal etching structure has a special technical effect capable of suppressing the higher-order mode.

For example, as in the embodiment, a polygonal mesa, for example, an octagonal mesa, may form a core reflective layer 250c, which is an octagonal waveguide core, on the surface. Accordingly, there is a special technical effect of suppressing movement to a higher order mode because a mismatch between the polygonal mesa and the circular waveguide core of the insulating region 242 is made.

Next, FIG. 15 is data showing a loss according to a transverse mode according to a cross-sectional shape of a mesa in a surface emitting laser device according to an embodiment.

Based on the loss according to the transverse mode of the circle in comparative example 2, square may be relatively unsuitable for higher mode suppression because the loss of mode is low.

On the other hand, in the embodiment, since the loss of a hexagon or an octagon is higher than a circle, there is a special technical effect that can help with higher mode suppression.

According to the embodiment, there is a complex technical effect of improving light extraction, suppressing high-order mode, and reducing a beam angle through surface polygonal etching.

For example, according to the surface emitting laser device in the embodiment, since light extraction is higher by reducing light loss in an insulating region, there is a technical effect of generating higher power with the same current.

In addition, according to the embodiment, there is a technical effect of suppressing a higher-order mode that deteriorates the driving characteristics of the surface emitting laser device.

Further, according to the embodiment, there is a technical effect of reducing the divergence angle by collecting light through etching.

The surface emitting laser device according to the embodiment may help to improve the performance of a VCSEL in which a high-order mode accompanying the use of high power is inevitable. In addition, the embodiment has a technical effect capable of improving the performance of a ToF distance recognition camera light emitting unit, a structured light distance recognition camera light emitting unit, and a Lidar.

Next, FIG. 16A is a perspective view of a second reflective layer 250 and a trench region T of a surface emitting laser device according to an exemplary embodiment.

FIG. 16B is a first top view of the first core reflective layer 250C1 and the aperture 241 of the surface emitting laser device according to the embodiment illustrated in FIG. 16A.

A circular aperture 241 may be defined by a circular insulating region 242 in the first top view. The aperture 241 may have a predetermined radius r.

The first core reflective layer 250C1 may be disposed to vertically overlap the circular aperture 241.

At this time, when the first core reflective layer 250C1 and the aperture 241 are viewed vertically, the aperture 241 may be disposed inwardly to the first core reflective layer 250C1. For example, a circular first horizontal cross-section of the aperture 241 may be inscribed with respect to a polygonal second horizontal cross-section of the first core reflective layer 250C1.

Next, FIG. 16C is a second top view of the second core reflective layer 250C2 and the aperture 241 of the surface emitting laser device according to the embodiment illustrated in FIG. 16A.

In the second top view, a circular aperture 241 may be defined by a circular insulating region 242. The second core reflective layer 250C2 may be disposed to vertically overlap the circular aperture 241.

In this case, when viewed vertically between the second core reflective layer 250C2 and the aperture 241, the aperture 241 may be disposed externally to the second core reflective layer 250C2. For example, the circular first horizontal cross-section of the aperture 241 may circumscribe the polygonal second horizontal cross-section of the second core reflective layer 250C2.

At this time, FIGS. 17A and 17B are undisclosed results obtained by simulating the structures of the first core reflective layer 250C1 and the second core reflective layer 250C2 circumscribed based on the octagonal polygonal core reflective layer. There is a special technical effect of reducing light loss in the structure of the second core reflective layer 250C2 circumscribed as described above.

Next, FIG. 18 is a cross-sectional view of a surface emitting laser device 202 according to a second embodiment.

The second embodiment can adopt the technical features of the first embodiment, and the main features of the second embodiment will be described below.

In the second embodiment, a second cladding insulating layer 270d may be disposed on one sidewall of the trench region T, and a second contact electrode 282 may be disposed on the other sidewall of the trench region T.

For example, in the second embodiment, the second cladding insulating layer 270d may be disposed on the side of the core reflective layer 250c, and the second cladding insulating layer 270d may be disposed on the other sidewall of the trench region T and the bottom of the trench region T. Two contact electrodes 282 may be disposed.

The second contact electrode 282 may be electrically connected to the second pad electrode 284 disposed on the second reflective layer 250.

According to the second embodiment, the second cladding insulating layer 270d is disposed to surround the core reflective layer 250c to reduce light loss to maximize light extraction efficiency and at the same time, as the second contact electrode 282 is in electrical ohmic contact with the second reflective layer 250 exposed in the trench region T, there is a complex technical effect in which electrical characteristics are improved and luminous efficiency can be remarkably improved.

Next, FIG. 19 is a cross-sectional view of a surface emitting laser device 203 according to a third embodiment.

The third embodiment may adopt the technical features of the first embodiment or the second embodiment, and the main features of the third embodiment will be described below.

In the first and second embodiments, the outer reflective layer 250b remains in the second mesa etching, but according to the third embodiment, the outer reflective layer 250b may not remain in the second mesa etching.

Accordingly, according to the third embodiment, the third cladding insulating layer 270e is disposed so as to surround the side surface of the core reflective layer 250c, and the third cladding insulating layer 270e can be extended and placed on an exposed top surface of the second reflective layer 250.

The third embodiment may include a third contact electrode 285 electrically connected to the exposed second reflective layer 250.

According to the third embodiment, the second cladding insulating layer 270d is disposed so as to surround the core reflective layer 250c to reduce light loss, thereby maximizing light extraction efficiency, and not leaving a separate outer reflective layer 250b. As a result, there is a special technical effect that can increase the effectiveness and reliability of the process. In addition, as the third contact electrode 285 is in electrical ohmic contact with the exposed second reflective layer 250, electrical characteristics are improved, and thus luminous efficiency can be remarkably improved.

INDUSTRIAL APPLICABILITY (Mobile Terminal)

FIG. 19 is a perspective view of a mobile terminal to which a surface emitting laser device is applied according to an embodiment.

As shown in FIG. 19, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as a light emitting unit.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which an auto focus function using an image of the camera module 1520 is deteriorated, for example, in a proximity or dark environment of 10 m or less. The autofocusing device 1510 may include a light emitting unit including a vertical cavity surface emission laser (VCSEL) semiconductor device, and a light receiving unit that converts light energy such as a photodiode into electrical energy.

Features, structures, effects, and the like described in the above embodiments are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, contents related to such combinations and modifications should be interpreted as being included in the scope of the embodiments.

Although the embodiments have been described above, these are only examples and are not intended to limit the embodiments, and those of ordinary skill in the field to which the embodiments belong to various types not illustrated above without departing from the essential characteristics of this embodiment. It will be seen that branch transformation and application are possible. For example, each component specifically shown in the embodiment can be modified and implemented. And differences related to these modifications and applications should be construed as being included in the scope of the embodiments set in the appended claims.

The invention claimed is:

1. A surface emitting laser device, comprising:
a first reflective layer;
an active layer on the first reflective layer;
an aperture region disposed on the active layer and including an aperture and an insulating region disposed around the aperture;
a second reflective layer on the aperture region;
a first electrode formed on the first reflective layer;
a second electrode including a pad electrode and a contact electrode; and
a passivation layer disposed on the second reflective layer,
wherein the second reflective layer includes a trench region, a core reflective layer vertically disposed at a position corresponding to the aperture and surrounded by the trench region, and an outer reflective layer disposed radially outside of the trench region,
wherein the passivation layer includes a cladding insulating layer disposed within the trench region and around the core reflective layer, an upper insulating layer disposed on a top surface of the core reflective layer and vertically overlapping with the aperture of the aperture region, and an outer insulating layer disposed on a sidewall of the outer reflective layer,
wherein a horizontal cross-section of the aperture and a horizontal cross-section of the core reflective layer are different from each other,
wherein a bottom surface of the trench is formed within the second reflective layer and is directly above the insulation region of the aperture region, wherein a depth of the trench region is formed to a depth of 50% to 95% of a thickness of the second reflective layer, and wherein the contact electrode of the second electrode is formed on a top surface of the outer reflective layer and is laterally between the cladding insulating layer and the outer insulating layer.

2. The surface emitting laser device of claim 1, wherein the cladding insulating layer is disposed at a position vertically corresponding to the insulating region, wherein the second reflective layer includes the trench region in which a portion of an upper surface thereof is partially removed in a circular shape, and wherein the second reflective layer comprises the core reflective layer remaining inside the trench region and an outer reflective layer remaining outside the trench region.

3. The surface emitting laser device of claim 2, wherein the aperture comprises a first horizontal cross-section, wherein the core reflective layer comprises a second horizontal cross-section different from the first horizontal cross-section, wherein the aperture comprises a circular first horizontal cross-section, and wherein the core reflective layer comprises a polygonal second horizontal cross-section.

4. The surface emitting laser device of claim 3, wherein an inner periphery of the insulating region includes a circular horizontal cross-section, and wherein a circular first horizontal cross-section of the aperture is circumscribed with respect to the polygonal second horizontal cross-section of the core reflection layer.

5. The surface emitting laser device of claim 1, wherein the cladding insulating layer comprises an insulating material.

6. A surface emitting laser device, comprising:
a first reflective layer;
an active layer on the first reflective layer;
an aperture region disposed on the active layer and including an aperture and an insulating region disposed around the aperture;
a second reflective layer on the aperture region, wherein the second reflective layer including a trench region, a core reflective layer vertically disposed at a position corresponding to the aperture and surrounded by the trench region, and an outer reflective layer disposed radially outside of the trench region, and wherein the trench region is defined by a first sidewall of the core reflective layer, a bottom surface and a second sidewall of the outer reflective layer;
a first electrode formed on the first reflective layer;
a second electrode including a pad electrode and a contact electrode; and
a passivation layer disposed on the second reflective layer, wherein the passivation layer includes a cladding insulating layer disposed within the trench region and around the core reflective layer, an upper insulating layer disposed on a top surface of the core reflective layer and vertically overlapping with the aperture of the aperture region, and an outer insulating layer disposed on a sidewall of the outer reflective layer, wherein the cladding insulating layer is disposed on the first sidewall of the core reflective layer; and the contact electrode of the second electrode is disposed within the trench region and formed on the bottom surface and the second sidewall of the outer reflective layer which is facing the first sidewall of the core reflective layer, wherein the bottom surface of the trench is formed within the second reflective layer and is directly above the insulation region of the aperture region, and wherein a depth of the trench region is formed to a depth of 50% to 95% of a thickness of the second reflective layer.

7. The surface emitting laser device of claim 6, wherein the cladding insulating layer is disposed at a position vertically corresponding to the insulating region, wherein the aperture includes a first horizontal cross-section, and wherein the core reflective layer comprises a second horizontal cross-section different from the first horizontal cross-section.

8. A light emitting device comprising the surface emitting laser device of claim 1.

9. The surface emitting laser device of claim 3, wherein an inner periphery of the insulating region includes a circular horizontal cross-section, and wherein a circular first horizontal cross-section of the aperture is inscribed with respect to the polygonal second horizontal cross-section of the core reflection layer.

10. The surface emitting laser device of claim 1, wherein the cladding insulating layer comprises air.

11. The surface emitting laser device of claim 1, wherein the outer insulating layer, the upper insulating layer, and the cladding insulating layer are formed of the same material.

12. The surface emitting laser device of claim 2, wherein a side surface of the outer reflective layer includes an inclined side surface.

13. The surface emitting laser device of claim 12, wherein a width of the outer reflective layer increases in a direction of the active layer from an upper side of the second reflective layer.

14. The surface emitting laser device of claim 6, wherein the cladding insulating layer is disposed on a side of the core reflective layer.

15. The surface emitting laser device of claim 6, wherein a side surface of the outer reflective layer includes an inclined side surface.

16. A light emitting device comprising the surface emitting laser device of claim 6.

* * * * *